(12) United States Patent
Watanabe et al.

(10) Patent No.: US 9,093,400 B2
(45) Date of Patent: Jul. 28, 2015

(54) ORGANIC EL ELEMENT MANUFACTURING METHOD, ORGANIC EL APPARATUS, AND ELECTRONIC EQUIPMENT

(71) Applicant: SEIKO EPSON CORPORATION, Tokyo (JP)

(72) Inventors: Shotaro Watanabe, Chino (JP); Masahiro Uchida, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/504,989

(22) Filed: Oct. 2, 2014

(65) Prior Publication Data

US 2015/0097173 A1    Apr. 9, 2015

(30) Foreign Application Priority Data

Oct. 8, 2013    (JP) .................................. 2013-210774

(51) Int. Cl.
*H01L 51/00*    (2006.01)
*H01L 27/32*    (2006.01)
*H01L 51/56*    (2006.01)
*H01L 51/50*    (2006.01)

(52) U.S. Cl.
CPC ........ *H01L 27/3211* (2013.01); *H01L 51/0004* (2013.01); *H01L 51/0054* (2013.01); *H01L 51/5012* (2013.01); *H01L 51/5056* (2013.01); *H01L 51/5088* (2013.01); *H01L 51/56* (2013.01)

(58) Field of Classification Search
CPC ...... H01L 51/54; H01L 51/56; H01L 51/0545
USPC .......................................................... 257/40
See application file for complete search history.

(56) References Cited

U.S. PATENT DOCUMENTS

2008/0124570 A1    5/2008    Kondo et al.
2010/0289728 A1    11/2010   Nakatani et al.
2011/0114927 A1    5/2011    Obana et al.

FOREIGN PATENT DOCUMENTS

| JP | A-2001-351787 | 12/2001 |
| JP | 2006-190759 | 7/2006 |
| JP | A-2010-282899 | 12/2010 |
| JP | A-2011-108462 | 6/2011 |
| WO | WO 2009/113239 A1 | 9/2009 |

*Primary Examiner* — Dale E Page
(74) *Attorney, Agent, or Firm* — Oliff PLC

(57) ABSTRACT

An organic EL element manufacturing method includes coating ink which contains a functional layer forming material in a coating region which is configured by a pixel electrode and a partition wall which surrounds a periphery of the pixel electrode, where, in the coating ink, the ink is coated so as to satisfy the following expressions (1) to (3) in a case where a contact angle of the ink with respect to the side surface of the partition wall is set to $\theta bc$ and a contact angle with respect to a surface of the coating region where the ink is coated is set to $\theta lc$.

$$\theta bc \leq \theta lc \quad (1)$$

$$\theta bc \leq 5° \quad (2)$$

$$\theta lc \leq 20° \quad (3)$$

9 Claims, 11 Drawing Sheets

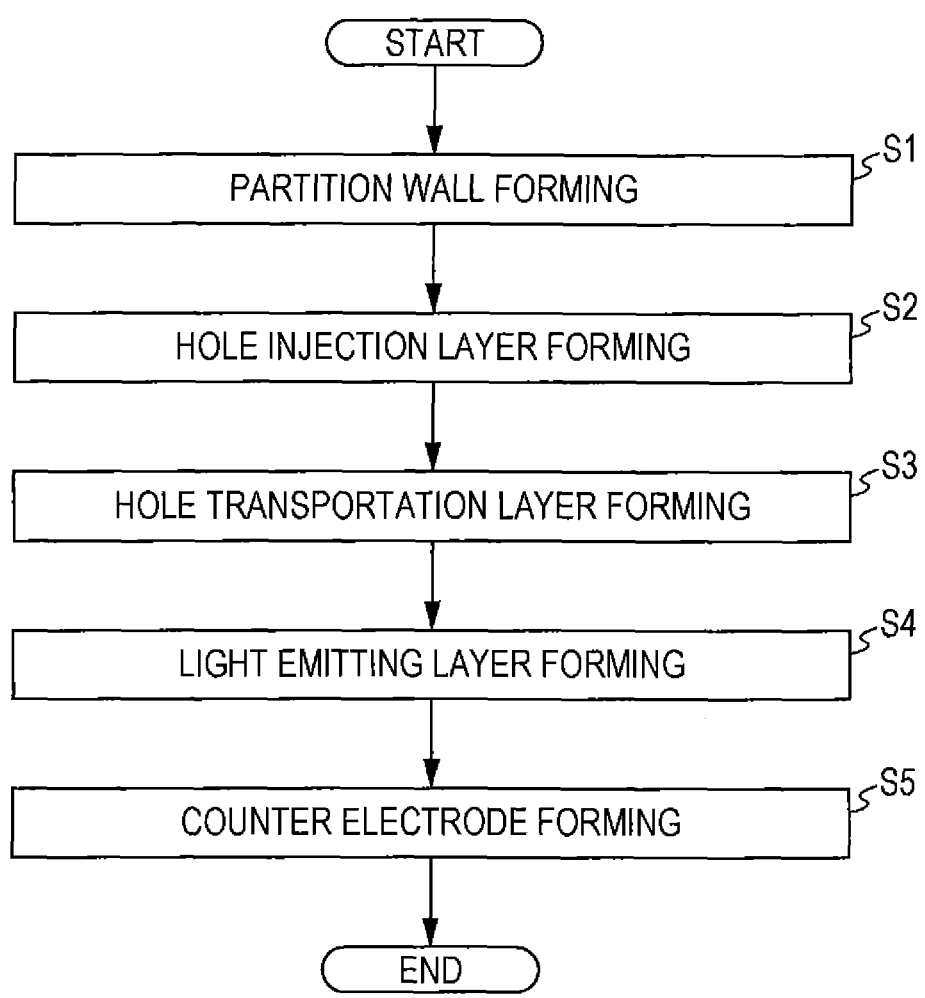

$\theta = 2\tan^{-1} h/r$

ORGANIC EL ELEMENT MANUFACTURING METHOD, ORGANIC EL APPARATUS, AND ELECTRONIC EQUIPMENT

BACKGROUND

1. Technical Field

The present invention relates to an organic EL element manufacturing method, an organic EL apparatus, and electronic equipment.

2. Related Art

An organic EL (electroluminescence) apparatus is an apparatus which is provided with an organic EL element, that has a functional layer including at least a light emitting layer between a pair of electrodes, and which performs illumination, image display, or the like according to the light emitted from the organic EL element. Then, in a case of an organic EL apparatus used for displaying a color image, there is a configuration where at least three types of organic EL elements which include an organic EL element which has a functional layer emitting red (R) light, an organic EL element which has a functional layer emitting green (G) light, and an organic EL element which has a functional layer emitting blue (B) light are regularly arranged on a substrate.

As methods for forming a plurality of functional layers, there are coating methods represented by an ink jet (IJ) method. The IJ method is a method for forming a functional layer by forming a partition wall, which surrounds one out of the pair of electrodes described above in plan view, on a substrate, discharging ink (a functional liquid) which contains a functional layer forming material from a nozzle of an ink jet head onto a region which is surrounded by the partition wall, and drying the ink which is coated. According to this coating method, since it is possible to form a plurality of types of functional layers at a low cost compared to a gas phase process such as a vacuum deposition method, it is possible to manufacture an organic EL apparatus, which is able to display color images, with high productivity. Then, in addition to polymer materials, low molecular weight materials have also been used as the functional layer forming material in recent years (refer to JP-A-2006-190759 and JP-A-2011-108462).

However, there is a concern that defects will be generated in the functional layer which is formed, in a case where ink which contains the low molecular weight material described above is used when the configuration of the partition walls and the like is not changed from the premise of using a polymer material which is suitable for a coating method. In detail, since the ink which contains the low molecular weight material has high fluidity and the molecules in the ink aggregate with each other due to intermolecular interaction, film forming defects due to biasing of the low molecular weight material are generated. Accordingly, there is a problem in that it is unlikely that uniform light emission will be obtained due to the film forming defects.

SUMMARY

The invention can be realized in the following forms or application examples.

Application Example 1

An organic EL element manufacturing method according to this application example includes forming a pixel electrode on a substrate, forming a partition wall which surrounds a periphery of the pixel electrode, coating ink which contains a functional layer forming material in a coating region which is surrounded by the partition wall, and forming a functional layer in the coating region by drying the ink which is coated, where, in the forming of a partition wall, the partition wall is formed such that a side surface of the partition wall which intersects with respect to a surface of the pixel electrode forms an angle of 40 degrees to 60 degrees with respect to the surface of the pixel electrode, and in the coating of the ink, the ink is coated so as to satisfy the following expressions (1) to (3), in a case where a contact angle of the ink with respect to the side surface of the partition wall is set to θbc and the contact angle with respect to a surface of the coating region where the ink is coated is set to θlc.

$$\theta bc \leq \theta lc \quad (1)$$

$$\theta bc \leq 5° \quad (2)$$

$$\theta lc \leq 20° \quad (3)$$

According to the organic EL element manufacturing method of this application example, compared to a case where an inclination angle of the side surface of the partition wall is set to an angle which exceeds, for example, 60 degrees, ink is supplied inside a concave section which is formed by the coating region and the partition wall in a state where the side surface area of the partition wall which contacts the ink is enlarged. That is, in comparison with a manufacturing method of the related art, the ink is coated in a state where the side surface area of the partition wall is enlarged with respect to the film thickness of the functional layer to be formed. Since the enlarging of the side surface area of the partition wall contributes to the enlarging of a selected width at a pinning position where the film forming of the functional layer is started with respect to the side surface of the partition wall due to the drying of the ink, favorable pinning is possible. In addition, the contact angle of the ink with respect to the side surface of the partition wall is formed to be lower than the angle with respect to the coating region, that is, the fact that the side surface of the partition wall has low liquid repellency compared to the surface of the coating region also contributes to the forming of favorable pinning. As a result, it is possible to form a functional layer where the uniformity of the film thickness is high and it is possible to obtain an organic EL element which has uniform light emission.

Application Example 2

In the organic EL element manufacturing method according to the application example described above, the functional layer includes at least three layers of a hole injection layer, a hole transportation layer, and a light emitting layer which are laminated in sequence on the pixel electrode, and at least one layer out of the three layers is formed by dropping the ink so as to satisfy the expressions (1) to (3).

According to such a manufacturing method, it is possible to form at least one layer out of each of the layers which form the functional layer with high film thickness uniformity. Accordingly, it is possible to obtain an organic EL element which has uniform light emission.

Application Example 3

In the organic EL element manufacturing method according to the application example described above, the ink contains the functional layer forming material which includes a polymer material and a low molecular weight material.

In the manufacturing method of the application example as described above, the side surface area of the partition wall is enlarged and the side surface of the partition wall is formed with low liquid repellency compared to the surface of the coating surface. Accordingly, with such a manufacturing method, film forming is possible without causing aggregation or the like even when using a low molecular weight ink (an ink which contains the functional layer forming material which includes the low molecular weight material) with high fluidity, it is possible to form a functional layer where the uniformity of the film thickness is high, and it is possible to obtain an organic EL element where the light emitting efficiency, the lifespan and the like are improved.

Application Example 4

An organic EL apparatus according to this application example is provided with an organic EL element which is manufactured using the organic EL element manufacturing methods described above.

According to the application example, it is possible to provide an organic EL apparatus which has an excellent display quality.

Application Example 5

Electronic equipment according to this application example is mounted with the organic EL apparatus described above.

According to the configuration of the application example, it is possible to provide electronic equipment which has an excellent display quality.

BRIEF DESCRIPTION OF THE DRAWINGS

The invention will be described with reference to the accompanying drawings, wherein like numbers reference like elements.

FIG. 4 is a flow chart which illustrates an organic EL element manufacturing method.

FIG. 14A is a schematic diagram which illustrates a head mounted display (HMD) as the electronic equipment and FIG. 14B is a schematic diagram which illustrates a digital camera as the electronic equipment.

DESCRIPTION OF EXEMPLARY EMBODIMENTS

Below, description will be given of embodiments which embody the invention according to the diagrams. Here, the diagrams which are used are displayed by being enlarged or reduced as appropriate such that the portions which are described are in a recognizable state.

In addition, in the following forms, for example, a case of being described as "on a substrate" expresses a case of being arranged so as to contact the substrate, a case of being arranged on the substrate via another component, a case of being arranged such that a part thereof contacts the substrate, or a case where a part is arranged via another component.

Embodiment 1

Organic EL Apparatus

Figure 1:
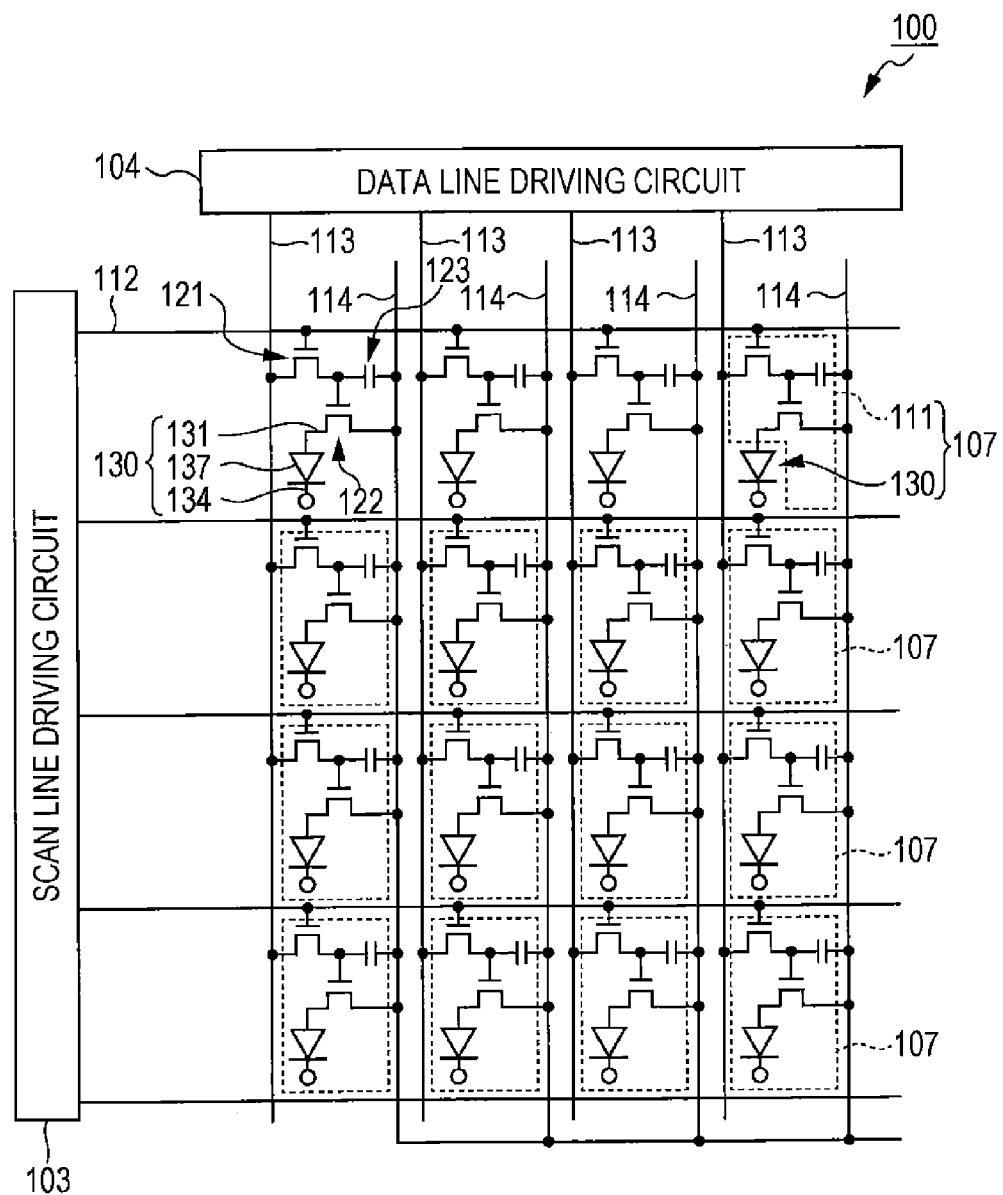
FIG. 1 is an equivalent circuit diagram which illustrates an electrical configuration of an organic EL apparatus.
Figure 2:
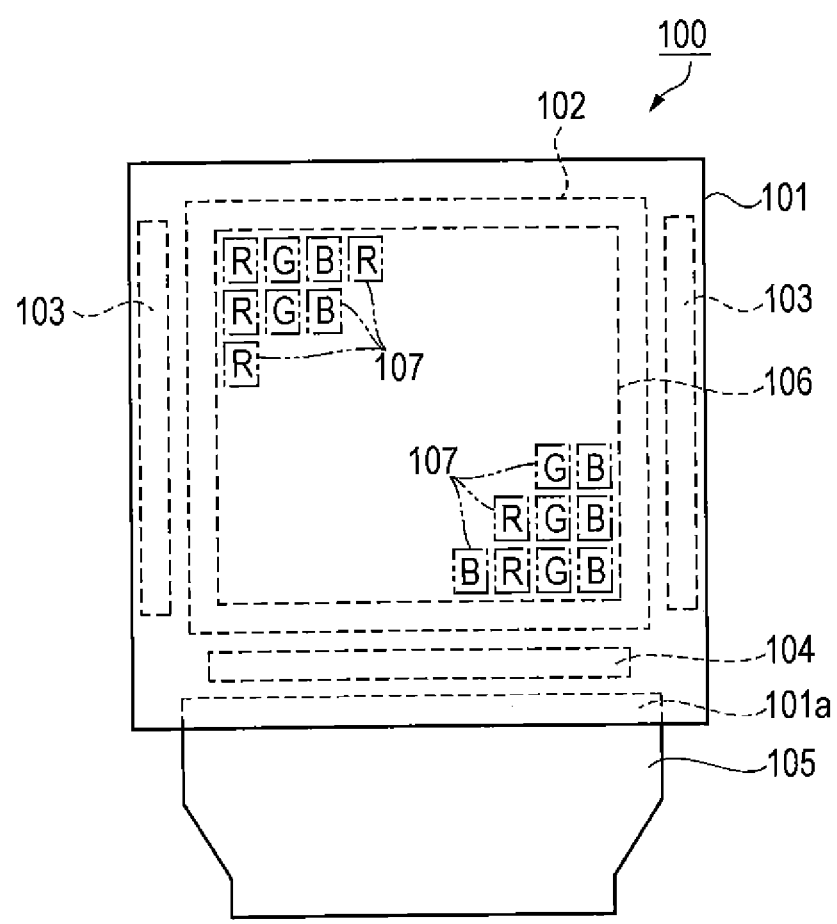
FIG. 2 is a schematic planar diagram which illustrates a configuration of the organic EL apparatus.
Figure 3:
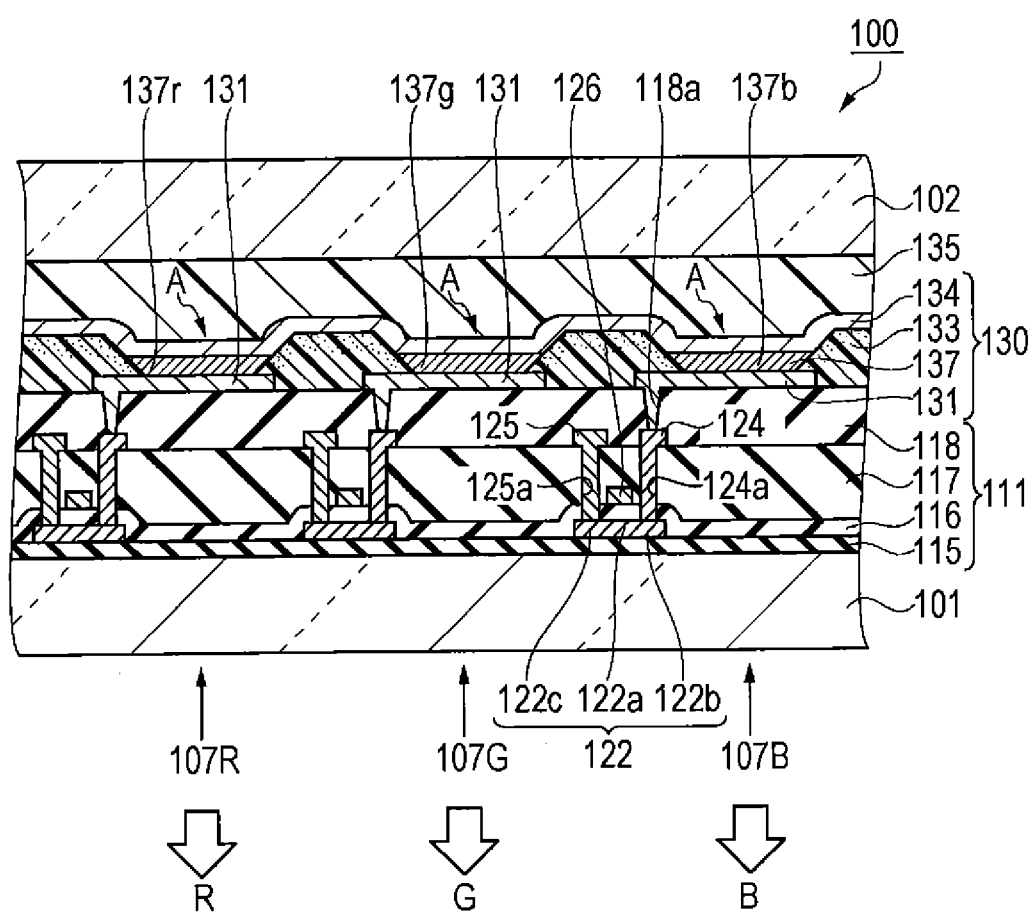
FIG. 3 is a schematic cross-sectional diagram which illustrates a structure of a pixel in the organic EL apparatus.

Firstly, description will be given of an example of an organic EL apparatus which is provided with an organic EL element with reference to FIG. 1 to FIG. 3. FIG. 1 is an equivalent circuit diagram which illustrates an electrical configuration of an organic EL apparatus, FIG. 2 is a schematic planar diagram which illustrates a configuration of the organic EL apparatus, and FIG. 3 is a schematic cross-sectional diagram which illustrates a structure of a pixel in the organic EL apparatus.

As illustrated in FIG. 1, an organic EL apparatus 100 has a plurality of scan lines 112 and a plurality of data lines 113 which intersect with each other and power lines 114 which are arranged in parallel with respect to each of the plurality of data lines 113. The organic EL apparatus 100 has a scan line driving circuit 103 with which the plurality of scan lines 112 are connected and a data line driving circuit 104 with which the plurality of data lines 113 are connected. In addition, the organic EL apparatus 100 has a plurality of light emitting pixels 107 which are arranged in a matrix form which corresponds to each of the intersecting sections of the plurality of scan lines 112 and the plurality of data lines 113.

The light emitting pixels 107 have an organic EL element 130 and a pixel circuit 111 which controls driving of the organic EL element 130.

The organic EL element 130 has a pixel electrode 131 as an anode, a counter electrode (a cathode) 134, and a functional layer 137 which is provided between the pixel electrode 131 and the counter electrode 134. It is possible to notate the organic EL element 130 as an electrical diode. Here, detailed description will be given later; however, the counter electrode 134 is formed as a common electrode through the plurality of light emitting pixels 107.

The pixel circuit 111 includes a switching transistor 121, a driving transistor 122, and a storage capacitor 123. It is possible to configure the two transistors 121 and 122 using, for example, an n-channel type or a p-channel type thin film transistor (TFT) or an MOS transistor.

A gate of the switching transistor 121 is connected with the scan line 112, one of a source or a drain is connected with the data line 113, and the other of the source or the drain is connected with the gate of the driving transistor 122.

One of a source or a drain of the driving transistor 122 is connected with the pixel electrode 131 of the organic EL element 130 and the other of the source or the drain is connected with the power line 114. The storage capacitor 123 is connected between the gate of the driving transistor 122 and the power line 114.

When the switching transistor 121 is in the on state due to the scan line 112 being driven, a potential based on an image signal which is supplied from the data line 113 at that time is held in the storage capacitor 123 via the switching transistor 121. The on/off state of the driving transistor 122 is determined according to the potential of the storage capacitor 123, that is, a gate potential of the driving transistor 122. Then, when the driving transistor 122 is in the on state, a current with a size according to the gate potential flows from the power line 114 via the driving transistor 122 to the functional layer 137, which is interposed between the pixel electrode 131 and the counter electrode 134. The organic EL element 130 emits light according to the size of the current which flows through the functional layer 137.

Here, a configuration of the pixel circuit 111 is not limited thereto. For example, a transistor for light emitting control which controls conductivity between the driving transistor 122 and the pixel electrode 131 may be provided between the driving transistor 122 and the pixel electrode 131.

As illustrated in FIG. 2, the organic EL apparatus 100 is provided with an element substrate 101, including light emitting pixels 107 of three colors which are R (red), G (green), and B (blue), and a sealing substrate 102 which is arranged to be opposed to the element substrate 101 at predetermined intervals. The sealing substrate 102 is bonded with the element substrate 101 using a sealing agent which has a high level of airtightness so as to seal a light emitting region 106 where a plurality of the light emitting pixels 107 are provided.

Here, in a case where any one of letters R(r), G(g), and B(b) is added to the end of a reference numeral in the description below, constituent components to which R(r) is added are elements which correspond to red light, constituent components to which G(g) is added are elements which correspond to green light, and constituent components to which B(b) is added are elements which correspond to blue light. Then, in cases where a letter is not added, the terms are general.

The light emitting pixel 107 is provided with the organic EL element 130 (refer to FIG. 3) and is a so called stripe type where the light emitting pixels 107 which are able to emit light of the same color are arranged in the vertical direction in the diagram. Here, the light emitting pixels 107 are minute in practice and are illustrated by being enlarged in the diagram for convenience of illustration. In addition, the arrangement of the light emitting pixels 107 is not limited to the stripe type and may be a delta type or a mosaic type arrangement.

The element substrate 101 is slightly larger than the sealing substrate 102 and two of the scan line driving circuits 103 which are connected with the pixel circuit 111 of the light emitting pixel 107 and one of the data line driving circuits 104 are provided in a portion which protrudes in the form of a frame. The scan line driving circuits 103 and the data line driving circuit 104, for example, may be implemented in the element substrate 101 as an IC where an electrical circuit is integrated, or the scan line driving circuits 103 and the data line driving circuit 104 may be formed directly on the surface of the element substrate 101.

A relay substrate 105 for connecting these scan line driving circuits 103 or the data line driving circuit 104 with an external driving circuit is implemented in a terminal section 101a of the element substrate 101. It is possible to use, for example, a flexible circuit substrate or the like as the relay substrate 105.

As illustrated in FIG. 3, the organic EL element 130 in the organic EL apparatus 100 has the pixel electrode 131 as an anode, a partition wall 133 which divides the pixel electrodes 131, and the functional layer 137 which includes an organic light emitting layer which is formed on the pixel electrode 131. Furthermore, the organic EL element 130 has the counter electrode 134 as a cathode which is formed so as to be opposed to the pixel electrode 131 via the functional layer 137. Here, the counter electrode 134 is not formed for each organic EL element 130 as the pixel electrode 131, but is formed over at least the entire region of the light emitting region 106 in common to a plurality of the organic EL elements 130. Accordingly, the counter electrode 134 is a common electrode.

The partition wall 133 is formed of photosensitive resin materials which have an insulation property such as a polyfunctional acrylic resin and is provided so as to divide each of a plurality of the pixel electrodes 131 by covering a part of the periphery of the pixel electrodes 131 which configures the light emitting pixels 107. The region which is surrounded by the partition wall 133 is a coating region A. The functional layer 137 is formed inside the coating region A.

In the organic EL apparatus 100 of the present embodiment, the side surface of the partition wall 133 which intersects with respect to the surface of the pixel electrode 131 is formed so as to form an angle of 40 degrees to 60 degrees with respect to the surface of the pixel electrode 131. Detailed description will be given later; however, by the side surface of the partition wall 133 having this angle, the film thickness uniformity or the like of the functional layer 137 which will be described later is improved and the angle contributes to an improvement in the display performance of the organic EL apparatus.

The pixel electrode 131 is connected with one out of the three terminals of the driving transistor 122 which is formed on the element substrate 101 and is an electrode on which, for example, ITO (Indium Tin Oxide), which is a transparent electrode material, is formed as a film with a thickness of approximately 100 nm.

The counter electrode 134 is formed by a metallic material which has a light reflection property such as, for example, Al or Ag, an alloy of the metallic material and another metal (for example, Mg), or the like.

The organic EL apparatus 100 of the present embodiment has a bottom emission type structure and extracts light, which is emitted by the functional layer 137 by causing a driving current to flow between the pixel electrode 131 and the counter electrode 134, from the element substrate 101 side by reflecting the light using the counter electrode 134. Accordingly, a transparent substrate such as glass is used as the element substrate 101. In addition, it is possible to use either a transparent substrate or an opaque substrate as the sealing substrate 102. Examples of opaque substrates include a thermosetting resin, a thermoplastic resin, and the like in addition to substrates where an insulation process such as surface oxidation is carried out on ceramics such as alumina or a metallic sheet such as stainless steel.

The pixel circuit 111 which drives the organic EL element 130 is provided in the element substrate 101. That is, a base insulating film 115 which is mainly formed of, for example, silicon oxide ($SiO_2$) is formed on the surface of the element substrate 101 and a semiconductor layer 122a formed of, for example, polysilicon or the like is formed on top of the base insulating film 115. A gate insulating film 116 which is mainly formed of either or both of $SiO_2$ and SiN is formed on the surface of the semiconductor layer 122a.

In addition, in the semiconductor layer 122a, the region which interposes the gate insulating film 116 and overlaps with a gate electrode 126 is a channel region. Here, the gate electrode 126 is a part of a scan line 112 which is not illustrated in the diagram. On the other hand, a first interlayer insulating film 117 which is mainly formed of $SiO_2$ is formed on the surface of the gate insulating film 116 which covers the semiconductor layer 122a and forms the gate electrode 126.

In addition, while a low concentration source region and a high concentration source region 122c are provided on the source side of the channel region in the semiconductor layer 122a, a low concentration drain region and a high concentration drain region 122b are provided on the drain side of the channel region, and this structure is a so called Light Doped Drain (LDD) structure. Out of these, the high concentration source region 122c is connected with a source electrode 125 via a contact hole 125a which opens across the gate insulating film 116 and the first interlayer insulating film 117. The source electrode 125 is configured as a part of the power line 114 (which is not illustrated in the diagram). On the other hand, the high concentration drain region 122b is connected with a drain electrode 124 which is provided in the same wiring layer as the source electrode 125 via a contact hole 124a which opens across the gate insulating film 116 and the first interlayer insulating film 117.

A second interlayer insulating film 118 is formed on the upper layer of the first interlayer insulating film 117 where the source electrode 125 and the drain electrode 124 are formed. The second interlayer insulating film 118 is formed in order to remove surface unevenness due to the driving transistor 122 which configures the pixel circuit 111, the source electrode 125, the drain electrode 124, or the like and is configured mainly of $SiO_2$ in the same manner as the first interlayer insulating film 117 and a planarization process such as CMP is carried out thereon.

Then, the pixel electrode 131 is formed on the surface of the second interlayer insulating film 118 and is also connected with the drain electrode 124 via a contact hole 118a which is provided in the second interlayer insulating film 118. That is, the pixel electrode 131 is connected with the high concentration drain region 122b of the semiconductor layer 122a via the drain electrode 124. The counter electrode 134 is connected with the GND. Accordingly, a driving current which is supplied from the power line 114 to the pixel electrode 131 described above and which flows between the counter electrode 134 and the pixel electrode 131 is controlled by the driving transistor 122. Due to this, it is possible for the pixel circuit 111 to perform color display by causing the desired organic EL element 130 to emit light.

The functional layer 137 is formed of a plurality of thin film layers which include a hole injection layer, a hole transportation layer, and a light emitting layer which are formed of organic films and laminated in this sequence from the pixel electrode 131 side.

The hole injection layer has a function of facilitating the injection of holes from the pixel electrode 131.

The hole transportation layer is provided between the hole injection layer and the light emitting layer and is provided in order to improve the transportability (injectability) of holes with respect to the light emitting layer and to suppress electrons penetrating from the light emitting layer to the hole injection layer. That is, the hole transportation layer has a function of improving the efficiency of light emission due to bonding between the holes and the electrons in the light emitting layer.

In the light emitting layer, the holes and the electrons which are injected form excitons and a part of the energy is discharged as fluorescence or phosphorescence when the excitons disappear (when the electrons and the holes are bonded again). That is, the light emitting layer has a function of emitting light due to energization. Here, the configuration of the functional layer 137 is not limited to a configuration which has a hole injection layer, a hole transportation layer, and a light emitting layer and may include an organic layer or an inorganic layer for controlling the flow of carriers (holes or electrons).

In the present embodiment, these thin film layers are manufactured using a manufacturing method which will be described later and each of the hole injection layer, the hole transportation layer, and the light emitting layer has a substantially uniform film thickness and a stable film shape (a cross-sectional shape). A desired light emitting efficiency and light emitting lifespan are each obtained in functional layers 137r, 137g, and 137b where different colors of light are emitted and the display performance of the organic EL apparatus is improved. Here, description will be given below of the forming materials and the like of the each of the layers described above.

The element substrate 101 which has the organic EL element 130 is solidly sealed with the sealing substrate 102 without an interval via a sealing layer 135 where a thermosetting epoxy resin or the like is used as a sealing member.

Here, the organic EL apparatus 100 of the present embodiment is not limited to being a bottom emission type and for example, may be a top emission type structure which extracts light emitted from the organic EL element 130 from the sealing substrate 102 side through reflection using the pixel electrode 131 by forming the pixel electrode 131 using conductive materials with a light reflecting property and forming the counter electrode 134 using transparent conductive materials. In addition, in a case of using the top emission type, there may be a configuration where color filters which correspond to the colors of the light emitted by the organic EL element 130 are provided so as to correspond to each of the organic EL elements 130. Furthermore, in a case where the organic EL apparatus 100 has a color filter, there may be a configuration where white light is emitted from the organic EL element 130.

Organic EL Element Manufacturing Method

Next, more detailed description will be given of the manufacturing method of the organic EL element 130 with reference to FIG. 4 to FIG. 7C. FIG. 4 is a flow chart which illustrates an organic EL element manufacturing method and FIGS. 5A to 5D, FIGS. 6A to 6D, and FIGS. 7A to 7C are schematic cross-sectional diagrams which illustrate the organic EL element manufacturing method of the present embodiment.

Here, it is possible to form elements other than the organic EL element 130 out of the elements which configure the organic EL apparatus 100, that is, the pixel circuit 111, the pixel electrode 131, (refer to FIG. 1 and FIG. 3) which is electrically connected with the pixel circuit 111, and the like using a manufacturing method which is known in the art. Accordingly, in FIG. 5A to FIG. 7C, the pixel circuit 111 and the like are omitted from the diagrams. Then, description of the manufacturing method of the organic EL element 130 thereafter will be given in sequence from the step after the pixel electrode 131 is formed.

As illustrated in FIG. 4, the manufacturing method of the organic EL element 130 of the present embodiment is provided with at least a partition wall forming step (step S1), a hole injection layer forming step (step S2), a hole transportation layer forming step (step S3), a light emitting layer forming step (step S4), and a counter electrode forming step (step S5).

The partition wall forming step of step S1 has five steps which are a photosensitive resin layer forming step, a pre-baking step, an exposing step, a developing step, and a post-baking step.

Figure 5A:
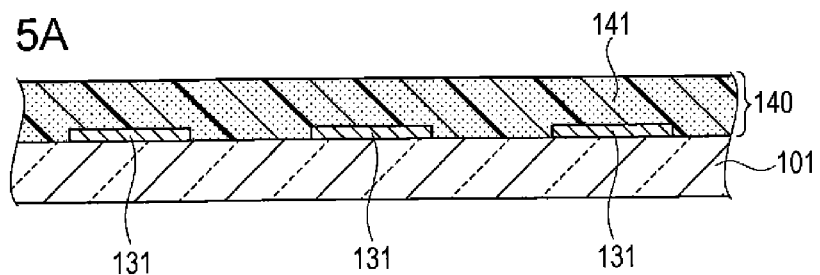
FIGS. 5A to 5D are schematic cross-sectional diagrams which illustrate the organic EL element manufacturing method.

In the photosensitive resin layer forming step, a photosensitive resin layer 140 is formed by drying after coating photosensitive resin materials which include a liquid repelling agent 141 with a thickness of approximately 1 μm to 3 μm onto the surface of the element substrate 101 where the pixel electrodes 131 are formed as illustrated in FIG. 5A. Examples of the coating method include a spin coating method, a transfer method, a slit coating method, and the like. Examples of the photosensitive resin materials include a negative type polyfunctional acrylic resin. In addition, examples of the liquid repelling agent 141 include fluorine based compounds or siloxane based compounds. In the present embodiment, the photosensitive resin layer 140 with a film thickness of substantially 2 μm is formed by coating a resin solution which is mainly composed of a polyfunctional acrylic resin which includes a fluorine based compound in the range of approximately 0.5 wt % to 10 wt % using the spin coating method.

Figure 5B:
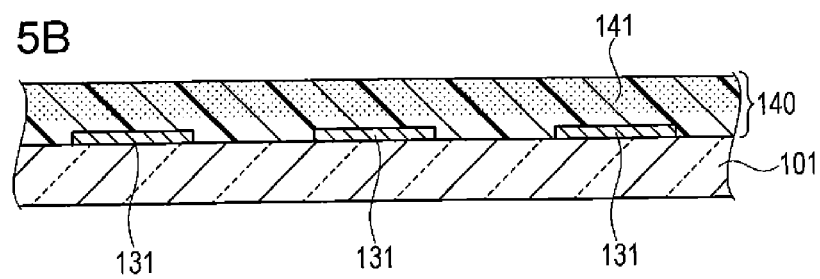

In the pre-baking step, a pre-baking process is implemented which carries out a heating process on the photosensitive resin layer 140 described above for two minutes at 110° C. to 120° C. in an air atmosphere. Due to this process, as illustrated in FIG. 5B, the liquid repelling agent 141 which is distributed substantially uniformly in the photosensitive resin layer 140 moves to the vicinity of the surface of the photosensitive resin layer 140, more specifically, within approximately 1.5 μm from the surface and is in a state of being concentrated there.

Figure 5C:
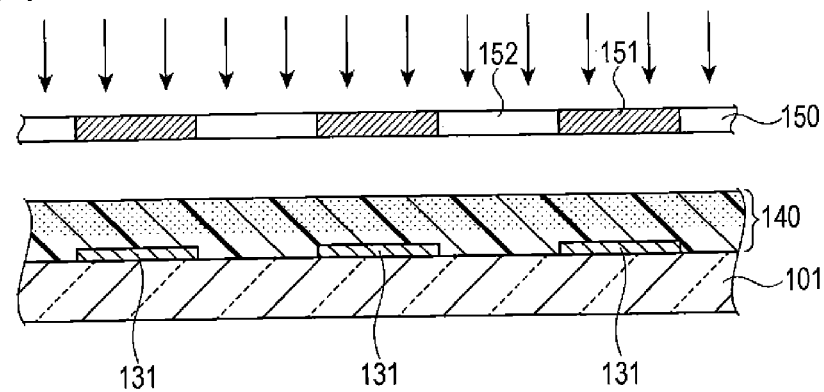

In the exposing step, as illustrated in FIG. 5C, the negative type photosensitive resin layer 140 is exposed using an exposure mask 150 which has a light shielding section 151 and a light transmitting section 152 which correspond to the coating region A. The exposure is carried out using ultraviolet rays by matching the positions of the element substrate 101 and the exposure mask 150 such that the light shielding section 151 and the pixel electrode 131 substantially overlap. As a condition of the exposure, for example, the exposure amount of ultraviolet rays is 540 mW/cm² and the exposure time is 65 seconds. The portion which is exposed in the photosensitive resin layer 140 is polymerized and is made insoluble with respect to a developing solution.

Figure 5D:
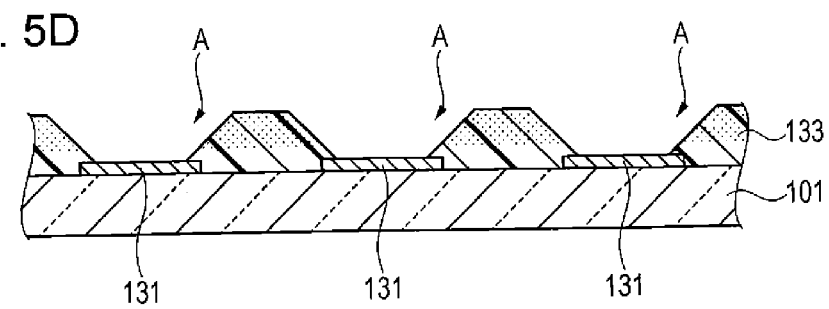

In the developing step, the photosensitive resin layer 140 which is exposed is developed and the partition wall 133 and the coating region A, which is a region which is surrounded by the partition wall 133, are formed as illustrated in FIG. 5D. Examples of the developing conditions include a method for coating a TetraMethyl Ammonium Hydroxide (TMAH) solution of 2.38 wt % (0.261N) as a developing solution while rotating the element substrate 101. The developing time is approximately 30 seconds.

As described above, in the photosensitive resin layer 140 before the developing, the liquid repelling agent 141 is concentrated within approximately 1.5 μm from the surface of the photosensitive resin layer 140. Accordingly, in the thickness direction of the partition wall 133 which is formed in the developing step, a portion within 0.5 μm from the pixel electrode 131 does not include the liquid repelling agent 141 or includes a small amount thereof, that is, is a portion where the side surface is lyophilic in a case where the partition wall 133 is formed as described later.

In addition, it is possible to incline the side surface of the partition wall 133 with respect to the surface of the pixel electrode 131 due to the pre-baking process described above. The pre-baking temperature and the inclination angle of the side surface of the partition wall 133 which is formed in the developing step with respect to the surface of the pixel electrode 131 are illustrated in Table 1. Here, the pre-baking times are all 2 minutes.

TABLE 1

| Pre-baking Temperature | Inclination Angle |
| --- | --- |
| 90° C. | 90° |
| 95° C. | 80° |
| 100° C. | 70° |
| 105° C. | 60° |
| 110° C. | 50° |
| 120° C. | 40° |

As illustrated in Table 1, in a case where the pre-baking temperature is 90° C., the side surface of the partition wall 133 is at a 90 degree angle (orthogonal) with respect to the surface of the pixel electrode 131. Then, the angle decreases as the pre-baking temperature increases. In the manufacturing method of the organic EL element 130 of the present embodiment, the pre-baking temperature is set to 110° C. to 120° C. as described above. Accordingly, the inclination angle of the partition wall 133 which is formed in the developing step is substantially 45 degrees.

In the post-baking step, the element substrate 101 where the partition wall 133 is formed is post-baked (heated). (A step of segregating the liquid repelling agent 141). Examples of the post-baking method include a method which leaves the element substrate 101 to stand for 60 minutes in an oven which is heated to 220° C. In addition, the post-baking may be implemented using a lamp annealing method. Due to the steps described above, the partition wall 133, which surrounds the pixel electrodes 131, and the coating region A, which is a region which is surrounded by the partition wall 133, are formed on the element substrate 101.

Figure 8:
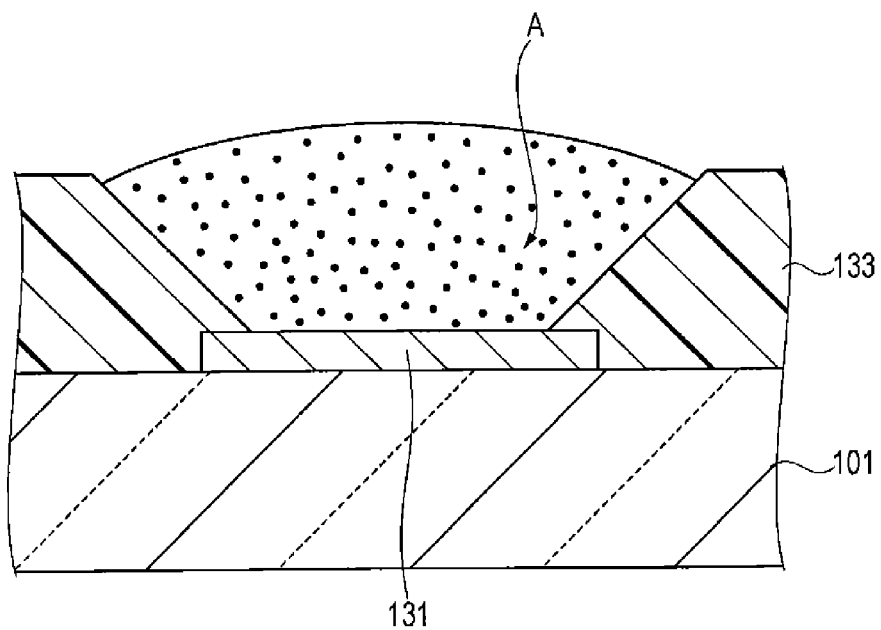
FIG. 8 is a diagram which illustrates an aspect of aggregation between molecules of a functional layer forming material.
Figure 9:
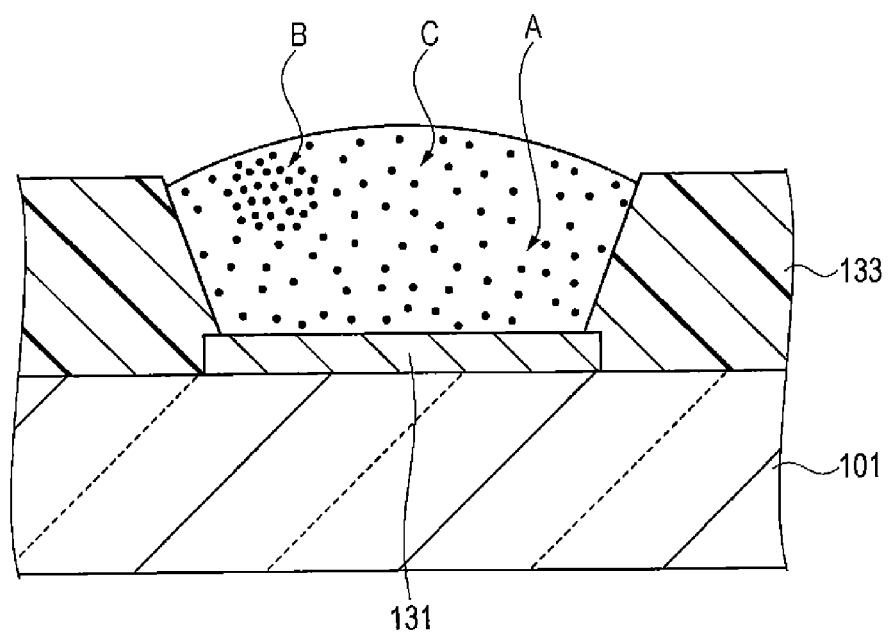
FIG. 9 is a diagram which illustrates an effect of an inclination angle of a partition wall side surface.

In this manner, the reason for inclining the side surface of the partition wall 133 is to suppress loss of film thickness uniformity due to molecules of the functional layer forming material aggregating when a functional liquid which includes a low molecular weight functional layer forming material with high fluidity is coated. FIG. 8 is a diagram which illustrates an aspect of aggregation between the molecules of the functional layer forming material. FIG. 9 is a diagram which illustrates an effect of providing an inclination angle in the side surface of the partition wall.

Figure 12:
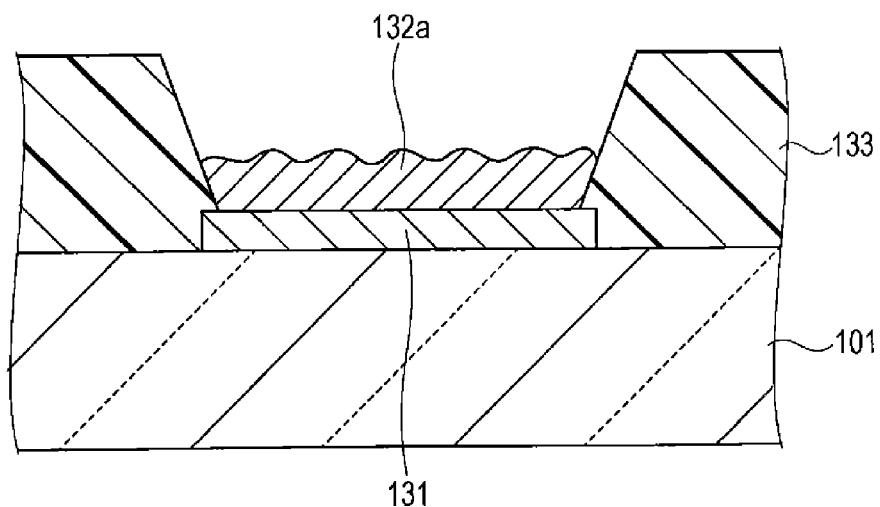
FIG. 12 is a diagram which illustrates a state where a hole injection layer is formed using a functional liquid which includes a low molecular weight hole injection layer forming material, in a case where a partition wall of the related art is used.

As illustrated in FIG. 9, in a case where the angle of the partition wall 133 with respect to the pixel electrode 131 is close to 90 degrees, solid content (which is shown with small dots in the diagram) of the functional layer forming material which is included in the functional liquid (no reference numeral) which is discharged to the coating region A has a tendency to aggregate in the pixel center in the process of film forming after being dried under reduced pressure. That is, in comparison with FIG. 8 where the partition wall is at less than 90 degrees, in a case where the partition wall is at close to 90 degrees as illustrated in FIG. 9, force for retaining ink inside the partition wall acts strongly from the partition wall with respect to the ink. Thus, the ink is pushed strongly to the pixel center and it is easy for the solid content to aggregate in the pixel center in the drying process. In addition, in comparison with FIG. 8, since the side surface area of the partition wall is small in the partition wall which is close to 90 degrees, there are fewer pinning points for the solid content with respect to the partition wall side surface. Thus, it is easy for the solid content to aggregate in the pixel center. The film thickness uniformity of the hole injection layer (and each of the other layers) which is formed in this manner decreases as illustrated in FIG. 12 and there is a possibility that uniform light emission will not be obtained in the organic EL element 130 after completion.

Figure 13:
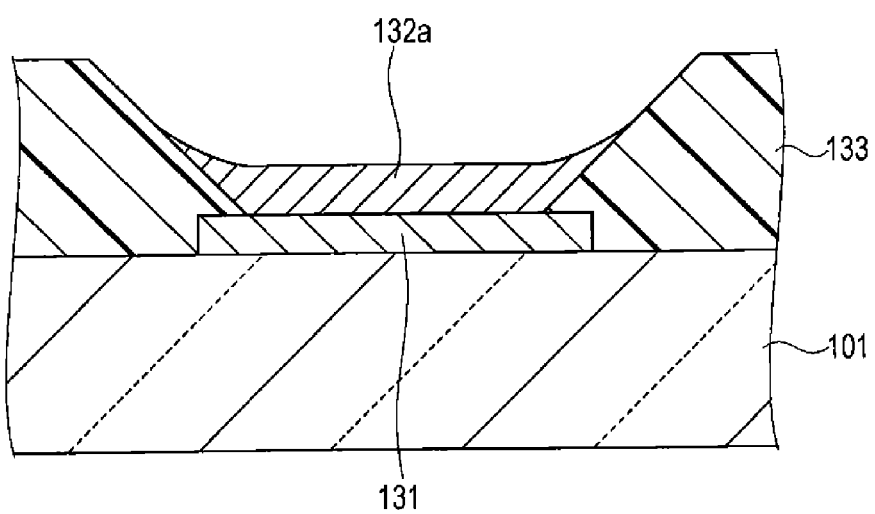
FIG. 13 is a diagram which illustrates the enlarged hole injection layer.

On the other hand, in a case where an inclination is provided in the side surface of the partition wall 133, it is possible to obtain a hole injection layer (and each of the other layers) where the film thickness uniformity is improved and it is possible to obtain the organic EL element 130 which has a uniform light emission state as illustrated in FIG. 13.

Here, the small dots in the diagram schematically express the differences in the distribution state, that is, the distribution density. Since the functional layer forming material is dissolved or dispersed, the functional layer forming material is not present as visible dots in the functional liquid.

Figure 6A:
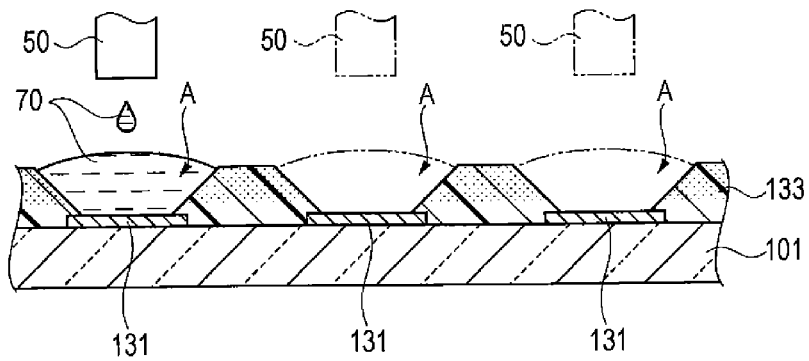
FIGS. 6A to 6D are schematic cross-sectional diagrams which illustrate the organic EL element manufacturing method.

Next, the hole injection layer forming step of step S2 is implemented. The hole injection layer forming step includes a step of coating the functional liquid onto the coating region A (a coating step) and a step of drying and solidifying the functional liquid which is coated (a solidifying step). The coating of the functional liquid in the present embodiment is performed using the IJ method. In detail, as illustrated in FIG. 6A, a functional liquid 70 which includes a hole injection layer forming material is discharged from a discharging head (an ink jet head) 50 of the liquid discharging apparatus (whose body is not illustrated in the diagram) to the coating region A as liquid droplets.

Then, in the present embodiment, the coating step is performed so as to satisfy the following expressions (1) to (3) in a case where a contact angle of the functional liquid 70 with respect to the side surface of the partition wall 133 is set to θbc and a contact angle of the functional liquid 70 with respect to the surface of the coating region A is set to θlc.

$$\theta bc \leq \theta lc \quad (1)$$

$$\theta bc \leq 5° \quad (2)$$

$$\theta lc \leq 20° \quad (3)$$

Figure 10:
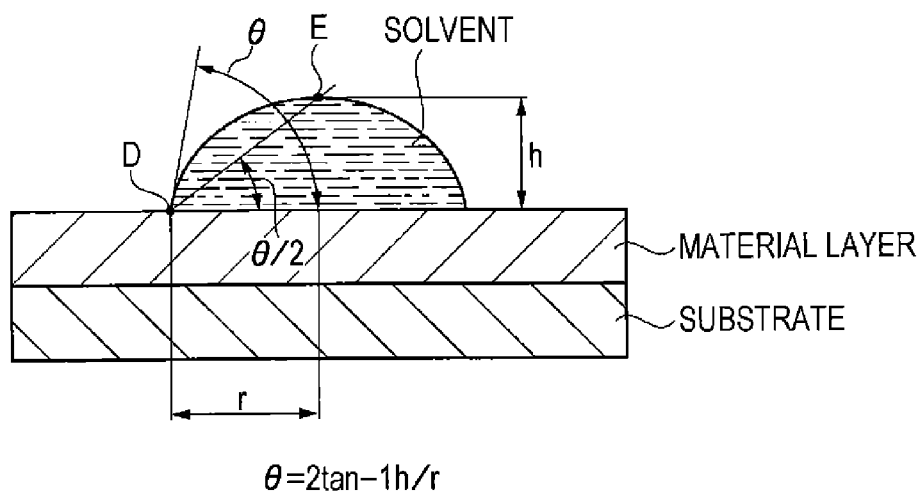
FIG. 10 is a diagram which illustrates a method for measuring a contact angle.

Here, description will be given of the contact angle. The contact angle is determined using a sessile drop method in the present embodiment. The measuring method of the contact angle according to the sessile drop method is illustrated in FIG. 10. As illustrated in FIG. 10, a functional liquid for evaluation is dripped as liquid droplets onto a material layer of the target constituent components (the partition wall 133 and the pixel electrode 131) which are formed on the substrate. When the volume of the functional liquid which is dripped is 4 µl or less, it is possible to regard the liquid droplets as a part of a sphere.

Here, the functional liquid 70 which is discharged to the coating region A rises to the upper end of the partition wall 133; however, the volume is reduced in the solidifying step and the functional liquid 70 only contacts the pixel electrode 131 and the lower section of the partition wall 133 directly before solidifying. Therefore, the measuring is carried out using photosensitive resin materials in a state where the liquid repelling agent 141 is not contained in a material layer of the partition wall 133.

The contact angle θ of the functional liquid 70 on the material layer is given by the following expression.

$$\theta = 2 \tan^{-1} h/r$$

(h is a height of a liquid droplet and r is a radius of the liquid droplet on the material layer)

For example, it is possible to determine the contact angle θ when the height h and the radius r of the liquid droplet are measured by optically imaging the liquid droplets on the material layer. Alternatively, when the angle between a line segment DE, which connects the contact point D and the top point E of the liquid droplet, and the surface of the material layer is determined, it is possible to determine the contact angle θ from the fact that the angle is θ/2.

Figure 11:
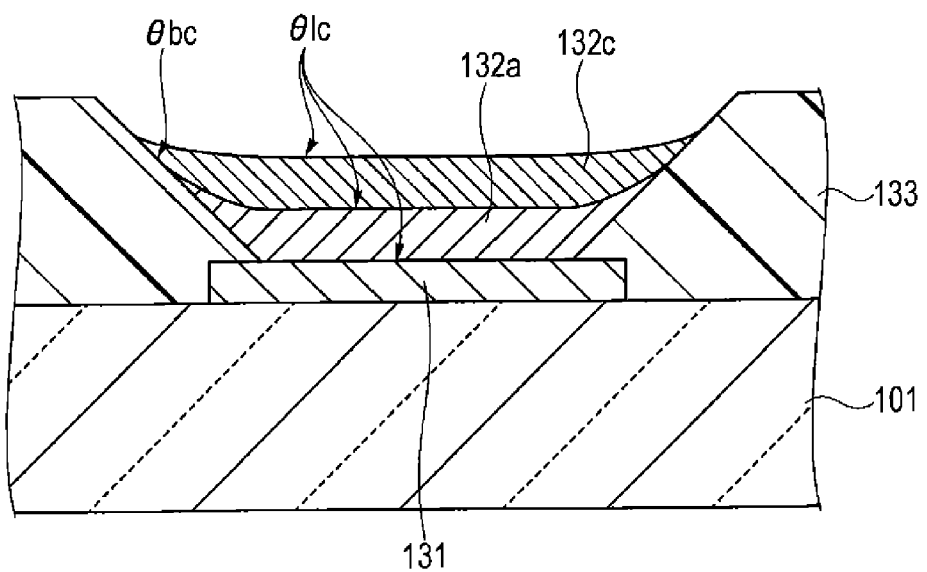
FIG. 11 is a diagram which illustrates a measuring object at a contact angle θ.

Here, for the contact angle θ with respect to the surface (the upper surface) of the coating region A, the surface which is the target of the contact angle θ is different depending on the step. FIG. 11 is a diagram which illustrates a measuring object at the contact angle θ. θlc indicates a measuring target at the contact angle with respect to the surface (the upper surface) of the coating region A and θbc indicates a measuring target at the contact angle θ with respect to the side surface of the partition wall 133.

As illustrated in FIG. 11, since the functional liquid 70 is coated onto the pixel electrode 131 in a case (in a step) of forming a hole injection layer 132a, ITO which is the forming material of the pixel electrode 131 is the measuring target at the contact angle θ with respect to the surface of the coating region A.

Then, since a functional liquid 80 (which will be described later) is coated onto the hole injection layer 132a in a case (in a step) of forming a hole transportation layer 132c, the hole injection layer 132a which is dried and solidified is the measuring target at the contact angle θ with respect to the surface of the coating region A.

Then, since a functional liquid 90 (which will be described later) is coated onto the hole transportation layer 132c in a case (in a step) of forming a light emitting layer 132, the hole transportation layer 132c which is dried and solidified is the measuring target at the contact angle θ with respect to the surface of the coating region A.

On the other hand, the measuring target at the contact angle θbc with respect to the side surface of the partition wall 133 is in common in the three steps as described above.

Each of the contact angles described above is determined according to the components or the like of the functional liquid which is discharged and the degree of lyophilicity or the like of the forming material in the region where the functional liquid is discharged. Then, in the present embodiment, the forming materials of the partition wall 133 and the pixel electrode 131 are determined as described above. Accordingly, the contact angle is determined according to the quality of materials in the functional liquid, in particular, the solvent which is added to the functional layer forming material.

The functional liquid 70 in the present embodiment is a liquid where 4,4',N,N'-Diphenylcarbazole, or N,N'-Bis(3-methylphenyl)-N,N'-bis(phenyl)benzidine is dissolved in dipentyl ether as a solvent. It was confirmed by experiments that the functional liquid 70 with this configuration satisfies the conditions of the contact angle described above (θbc≤θlc (the contact angle with respect to the pixel electrode 131), θbc≤5°, and θlc≤20°).

The solidifying step is implemented after the coating step is finished. The solidifying step is a step in which the functional liquid 70 described above is sintered by heating for thirty minutes at 200° C. in an air atmosphere after the functional liquid 70 is dried in a vacuum. Due to this step, solvent components of the functional liquid 70 are evaporated and removed and the hole injection layer 132a is formed on the pixel electrode 131 in the coating region A as illustrated in FIG. 6B.

Figure 6B:
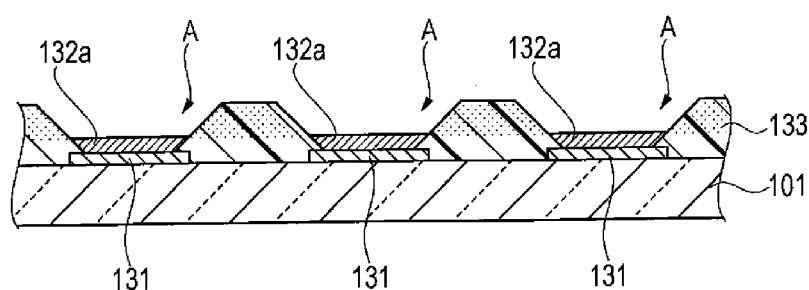

FIG. 13 is a diagram which illustrates the enlarged hole injection layer 132a (which is illustrated in FIG. 6B). As illustrated in the diagram, a peripheral section in the hole injection layer 132a, that is, a portion which contacts the partition wall 133 rises so as to follow the partition wall 133. This phenomenon is called pinning.

According to the manufacturing method of the organic EL element 130 of the present embodiment, the contact angle θbc of the functional liquid 70 with respect to the partition wall 133 (the lower section thereof) is smaller than the contact angle θlc with respect to the pixel electrode 131. Due to this, it is possible for the functional liquid 70 which is discharged to maintain a favorable state of contact without bouncing off the partition wall 133. It is possible to form favorable pins and improve the film thickness uniformity of the hole injection layer 132a on the pixel electrode 131 by implementing the solidifying step described above in this state.

In addition, the presence of the side surface which is inclined in the partition wall 133 contributes to the forming of favorable pins. Since the side surface area of the partition wall 133 is enlarged by the inclination angle of the side surface of the partition wall 133 being gentle (compared to being orthogonal) with respect to the pixel electrode 131 and the selection range of the pinning positions in the solidifying step of the functional liquid 70 is wide, it is assumed that the pins are favorably formed in this manner even when using the functional liquid 70 which contains a low molecular weight material with high fluidity.

By the pins being favorably formed, the film thickness (layer thickness) uniformity is improved in the portion of the inside of the hole injection layer 132a, that is, in the region which overlaps with the pixel electrode 131 in plan view. That is, the hole injection layer 132a is formed to be flat.

FIG. 12 is a diagram which illustrates a state where the hole injection layer 132a is formed using the functional liquid 70 described above, that is, the functional liquid 70 which includes a low molecular weight hole injection layer forming material, in a case where the inclination angle of the partition wall 133 is large (that is, substantially orthogonal) and the contact angle θbc does not satisfy the conditions described above as a comparative example.

As illustrated in the diagram, since the side surface area of the partition wall 133 is small and the side surface of the partition wall 133 does not have affinity with respect to the functional liquid 70 which is discharged, pins are not favorably formed and the film thickness (layer thickness) uniformity of the hole injection layer 132a on the pixel electrode 131 is deteriorated.

In contrast to this, since the side surface of the partition wall 133 is inclined at the angle of 40 degrees to 50 degrees in the manufacturing method of the organic EL element 130 of the present embodiment, it is possible to favorably preserve the state of the film (that is, the film thickness uniformity) after the forming even when using the functional liquid 70 which contains a low molecular weight material with high fluidity. Here, description will be given below of the relationship between the inclination angle of the side surface of the partition wall 133 and the state of the film after the forming.

Figure 6C:
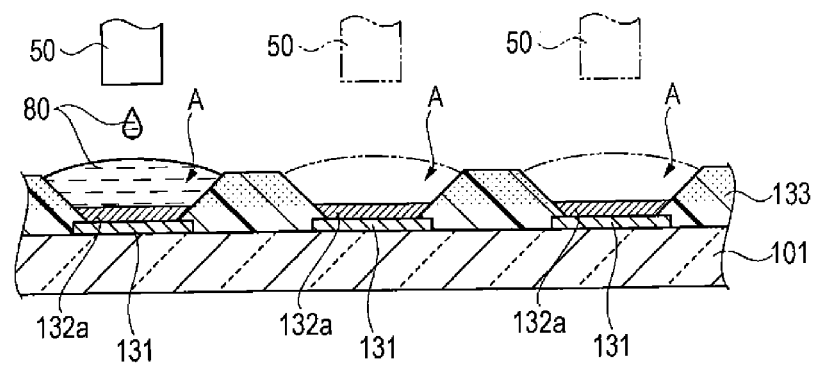

Next, the hole transportation layer forming step of step S3 is implemented. That is, the hole transportation layer 132c is formed on the upper layer of the hole injection layer 132a. The hole transportation layer forming step includes a step of coating the functional liquid onto the coating region A (a coating step) and a step of drying and solidifying the functional liquid which is coated (a solidifying step) in the same manner as the hole injection layer forming step described above. Then, the coating of the functional liquid is performed using the IJ method in the same manner as the hole injection layer forming step. In detail, as illustrated in FIG. 6C, the functional liquid 80 which includes a hole transportation layer forming material (which is a low molecular weight material) is discharged as liquid droplets from a discharging head 50 to the coating region A (on the hole injection layer 132a).

Then, in the present embodiment, the point that the coating step is performed such that the contact angle θbc of the functional liquid 80 with respect to the side surface of the partition wall 133 and the contact angle θlc of the functional liquid 80 with respect to the coating region A satisfy the expressions (1) to (3) described above is also common to the hole injection layer forming step. However, since the hole injection layer 132a is already formed in the coating region A in the present step, the point that the contact angle θlc is a contact angle of the functional liquid 80 with respect to the hole injection layer 132a is different from the hole injection layer forming step described above.

Figure 6D:
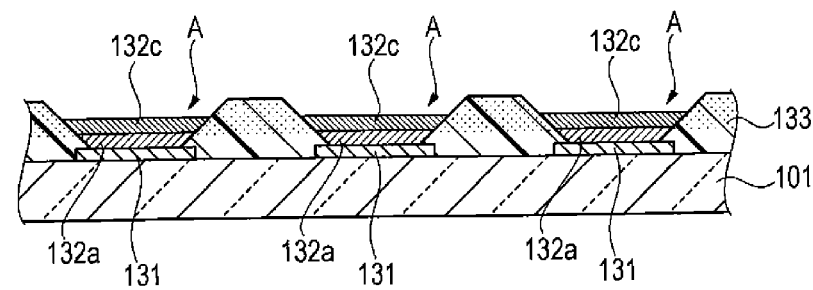

The solidifying step is implemented after the coating step is finished. As the solidifying step, heating is implemented for thirty minutes at 130° C. in an inert gas atmosphere after the functional liquid 80 described above is dried in a vacuum. Due to this step, the solvent components of the functional liquid 80 are evaporated and removed and the hole transportation layer 132c is formed on the hole injection layer 132a in the coating region A as illustrated in FIG. 6D.

In the same manner as when forming the hole injection layer 132a described above, the present step discharges the functional liquid 80 into the coating region A which is surrounded by the partition wall 133 which has the inclination angle of 45 degrees such that the contact angles θbc and θlc satisfy the expressions (1) to (3) described above. Accordingly, even when using the functional liquid 80 which contains a low molecular weight material with high fluidity, it is possible to form favorable pins and it is possible to form the hole transportation layer 132c where the film thickness (layer thickness) uniformity is improved.

Here, description will be given of the functional liquid 80. The functional liquid 80 is produced by dissolving 4,4',4"-tris(N,N-phenyl-3-methylphenylamino)triphenylamine, which is a low molecular weight hole transportation layer material, in dipentyl ether as a solvent. It was confirmed by experiments that the functional liquid 80 with this configuration satisfies the conditions of the contact angle described above (θbc≤θlc, θbc (the contact angle with respect to the hole injection layer 132a)≤5°, and θlc≤20°).

Figure 7A:
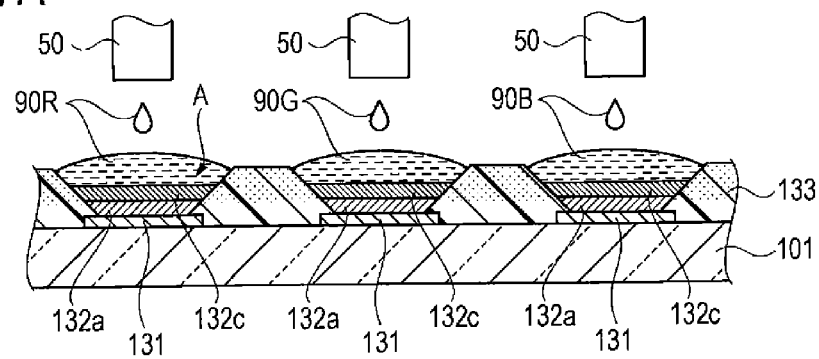
FIGS. 7A to 7C are schematic cross-sectional diagrams which illustrate the organic EL element manufacturing method.

Next, the light emitting layer forming step of step S4 is implemented. That is, light emitting layers 132 (132r, 132b, and 132g) are formed on the hole transportation layer 132c. The light emitting layer forming step includes a step of coating the functional liquid 90 onto the coating region A (a coating step) and a step of drying and solidifying the functional liquid which is coated (a solidifying step) in the same manner as each of the steps described above. Then, the coating of the functional liquid 90 is performed using the IJ method in the same manner as the hole injection layer forming step. In detail, as illustrated in FIG. 7A, the functional liquid 90 which includes a light emitting layer forming material (a light emitting material) (which is a low molecular weight material) is discharged as liquid droplets from the discharging head 50 to the coating region A (on the hole transportation layer 132c).

However, the present step is different from each of the steps described above in that there are three types of the functional liquid 90 which is discharged. The organic EL apparatus 100 which is manufactured in the present embodiment is an organic EL apparatus where color display is possible and has a total of three types of organic EL elements 130 which are an organic EL element 130R which emits red (R) light, an organic EL element 130G which emits green (G) light, and an organic EL element 130B which emits blue (B) light.

Then, the organic EL apparatus 100 obtains colored light using the materials which form the light emitting layer 132. Accordingly, the functional liquid 90 uses a total of three types of a functional liquid 90R which contains a red light emitting material, a functional liquid 90G which contains a green light emitting material, and a functional liquid 90B which contains a blue light emitting material. Then, the organic EL element 130R has a red light emitting layer 132r which is obtained by solidifying the functional liquid 90R, the organic EL element 130G has a green light emitting layer 132g which is obtained by solidifying the functional liquid 90G, and the organic EL element 130B has a blue light emitting layer 132b which is obtained by solidifying the functional liquid 90B. Here, description will be given below of the light emitting materials which correspond to each of the light emitting colors.

In the light emitting layer forming step, the coating step is also implemented such that the contact angle θbc of the functional liquid 90 with respect to the side surface of the partition wall 133 and the contact angle θlc of the functional liquid 90 with respect to the coating region A satisfy the above expressions (1) to (3) in the same manner as each of the steps described above.

Figure 7B:
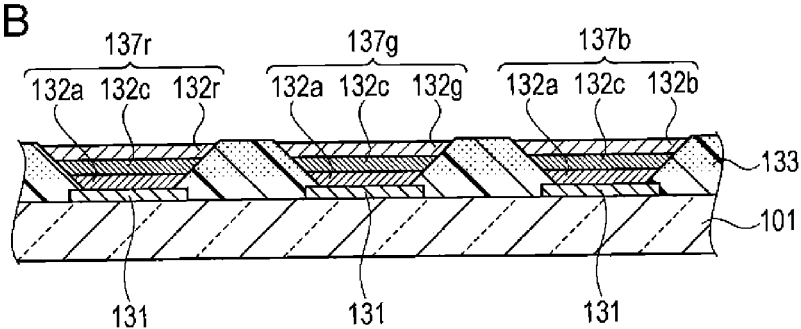

Then, in the present step, since the hole transportation layer 132c is already formed in the coating region A, the contact angle θlc is the contact angle of the functional liquid 90 with respect to the hole transportation layer 132c. The solidifying step is implemented after the coating step is finished. As the solidifying step, heating is implemented for ten minutes at 130° C. in an inert gas atmosphere after the functional liquid 90 described above is dried in a vacuum. Due to this step, the solvent components of the functional liquid 90 are evaporated and removed and the light emitting layers 132 (132r, 132g, and 132b) are formed on the hole transportation layer 132c in the film forming region A as illustrated in FIG. 7B.

In the same manner as each of the steps described above, in the present step, the functional liquid 90 is discharged into the coating region A which is surrounded by the partition wall 133 which has an inclination angle of 45 degrees such that the contact angles θbc and θlc satisfy the above expressions (1) to (3). Accordingly, even when using the functional liquid 90 which contains a low molecular weight material with high fluidity, it is possible to form favorable pins and it is possible to form the light emitting layers 132 (132r, 132g, and 132b) where the film thickness (layer thickness) uniformity is improved. Due to this, functional layers 137r, 137g, and 137b which include the hole injection layer 132a, the hole transportation layer 132c, and the light emitting layers 132 (132r, 132g, and 132b) are formed.

Here, description will be given of the functional liquid 90. The functional liquid 90 is produced by dissolving any out of the three types of light emitting materials described below, which are low molecular weight materials, in dipentyl ether as a solvent.

Examples of the red light emitting material include Iridium (III)bis(2-(2'-benzothienyl)pridinato-N,C3')(acetylacetonate).

Examples of the green light emitting material include Alq3 (Tris(8-hydroxyquinolato)aluminum(III)).

Examples of the blue light emitting material include Iridium(III)bis(2-(4,6-diflurophenyl)pyridinato-N,C2')picolinate.

It was confirmed by experiments that the functional liquid 90 with this configuration satisfies the conditions of the contact angle described above (θbc≤θlc (the contact angle with respect to the hole transportation layer 132c), θbc≤5°, and θlc≤20°).

Figure 7C:
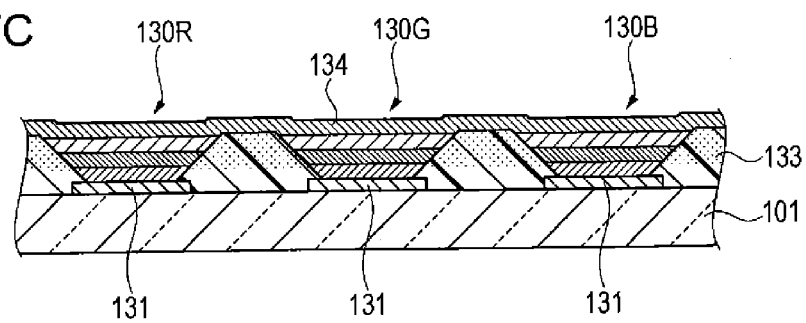

Next, the counter electrode forming step of step S5 is implemented when the forming of the light emitting layer 132 is finished. In step S5, as illustrated in FIG. 7C, the counter electrode 134 is formed so as to cover the partition wall 133 and each of the functional layers 137r, 137g, and 137b. Due to this, the organic EL element 130 is configured.

An alloy or the like of aluminum (Al), silver (Ag), and magnesium (Mg) is used as a material of the counter electrode 134. Films of Ca, Ba, and LiF where the work function is small may be formed on the side which is close to the functional layers 137r, 137g, and 137b. In addition, a protective layer of $SiO_2$, SiN or the like may be laminated on the counter electrode 134. In this manner, it is possible to prevent oxidation of the counter electrode 134. Examples of the method for forming the counter electrode 134 include a vapor deposition method, a sputtering method, a CVD method, and the like. In particular, the vapor deposition method is preferable in that it is possible to prevent damage to the functional layers 137r, 137g, and 137b due to heat.

Due to the steps described above, as illustrated in FIG. 7C, it is possible to form the organic EL elements 130 (130R, 130G, and 130B) which have the functional layers 137 which are formed of materials which include a low molecular weight material.

Here, a substrate bonding step is implemented after the organic EL element 130 is formed. The substrate bonding step is a step of sealing the organic EL element 130 or the like which is formed on the element substrate 101 by forming the sealing layer 135 on the entire surface of the element substrate 101 where the organic EL element 130 is formed and bonding the element substrate 101 and the sealing substrate 102 using the sealing layer 135 (refer to FIG. 3). The organic EL apparatus 100 is formed by this step (refer to FIG. 3).

According to the manufacturing method of the organic EL element 130 described above, it is possible to manufacture the organic EL element 130 which has the functional layers 137 where the film thickness uniformity is improved by adding an inclination angle to the side surface of the partition wall 133 and controlling the contact angles θbc and θlc of the functional liquid which is coated even when the functional layers 137 are formed using the functional liquid which contains the low molecular weight material and the coating method described above. Accordingly, it is possible to obtain the organic EL element 130 where light emitting defects such as brightness unevenness due to film thickness non-uniformity are reduced. Then, desired light emitting characteristics are realized by providing the organic EL element 130 and it is possible to obtain the organic EL apparatus 100 where a color display with a good appearance is possible.

Table 2 is a diagram which illustrates the effects according to the present embodiment along with those of a comparative example. Table 2 is a table where the film forming state (film thickness uniformity or the like) and the light emitting state are evaluated in cases where the inclination angle of the side surface of the partition wall 133 is changed from 90 degrees to 40 degrees. The evaluation of the film forming state is carried out in three stages which are ×: a state where the film thickness is non-uniform due to the aggregation of molecules, Δ: a state where a part of the film thickness is non-uniform due to the aggregation of molecules, and ○: a state where the film thickness is uniform without the aggregation of molecules being recognized. The evaluation of the light emitting state is carried out in only two stages. Then, the film forming states of the three layers which configure the functional layers 137 are each evaluated and the light emitting state of the organic EL element 130 is evaluated. Here, the contact angles θbc and θlc are all evaluated under the conditions illustrated in the above expressions (1) to (3).

TABLE 2

| | Film Forming State (Film Thickness Uniformity) | | | |
| --- | --- | --- | --- | --- |
| Inclination Angle | Hole Injection Layer | Hole Transportation Layer | Light Emitting Layer | Light Emitting State |
| 90° | x | x | x | x |
| 80° | x | x | x | x |
| 70° | Δ | Δ | x | x |
| 60° | ○ | ○ | ○ | ○ |
| 50° | ○ | ○ | ○ | ○ |
| 40° | ○ | ○ | ○ | ○ |

As illustrated in Table 2, both the film forming state and the light emitting state show favorable results when the inclination angle of the side surface of the partition wall 133 is within the range of 40 degrees to 60 degrees. Accordingly, it is possible to form the organic EL element 130 which is able to emit favorable light when the inclination angle of the partition wall 133 is 45 degrees as in the manufacturing method of the organic EL element 130 of the present embodiment.

Functional Liquid

It is possible to use the functional liquids (70, 80, and 90) in the embodiment described above by combining various types of materials with various types of solvents other than those described above. Below, description will be given of materials for which the effects were confirmed in practice by performing experiments with the manufacturing method of the organic EL element described above, that is, the organic EL element which has the partition wall 133 where the inclination angle is substantially 45 degrees.

Functional Liquid 70

Experiments were also performed using Poly vinyl carbazole which is a polymer hole injection layer material and Poly[N,N'-bis(4-butylphenyl)-N,N'-bis(phenyl)-benzidine] other than the two types of low molecular weight hole injection layer material described above as the functional liquid 70 which is used for forming the hole injection layer 132a. Then, further experiments were performed using each individual material of a total of four types of hole injection layer materials described above or combinations of two or more types (mixtures).

Then, regarding the solvents, experiments were performed using, in addition to the dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, tetraethylene glycol dimethyl ether, N-methylpyrrolidone, dimethylimidazolidinone, dimethyl sulfoxide, butyrolactone, 1,3-diisopropyl benzene 1,4-diisopropyl benzene, triisopropyl benzene, pentyl benzene, hexyl benzene, heptyl benzene, octyl benzene, nonyl benzene, 3-phenoxytoluene, 2-isopropyl naphthalene, dibenzyl ether, and isopropyl biphenyl.

As a result of the experiments described above, apart from cases where four types of solvents, which were 3-phenoxytoluene, 2-isopropylnaphthalene, dibenzyl ether, and isopropyl biphenyl, were used, results were obtained where the conditions of the contact angle θbc≤5° with respect to the side surface of the partition wall 133 and the contact angle θlc≤20° with respect to the coating region A were satisfied and where the film forming state (the film thickness uniformity) was also favorable. Here, in cases where the solvents were the four types described above, the results were that although it was possible to satisfy the condition of θbc≤5°, it was not possible to satisfy the condition of θlc≤20° and the film forming state (the film thickness uniformity) was also Δ, that is, the film thickness was partially in a non-uniform state due to the aggregation of molecules.

On the other hand, as a comparative example, experiments were performed using the functional liquid 70 with the configurations described above in a case where the inclination angle of the partition wall 133 exceeded 60 degrees more specifically, in a case where the inclination angle was 70 to 80 degrees. As a result, apart from cases where four types of solvent which are 3-phenoxytoluene, 2-isopropylnaphthalene, dibenzyl ether, and isopropyl biphenyl were used, the results were that although it was possible to satisfy the conditions of the contact angle θbc≤5° and the contact angle θlc≤20°, the film forming state (the film thickness uniformity) was also Δ, that is, the film thickness was partially in a non-uniform state due to the aggregation of molecules. Accordingly, the effects of setting the inclination angle of the partition wall 133 to 60 degrees or less, more specifically, substantially 45 degrees were confirmed.

Here, in a case where the solvents are four types of 3-phenoxytoluene, 2-isopropylnaphthalene, dibenzyl ether, and isopropyl biphenyl, the results were that it was not possible to satisfy the condition of θlc≤20° and the film forming state (the film thickness uniformity) was also x, that is, the film thickness was in a non-uniform state due to the aggregation of molecules.

In addition, regarding the functional liquid 70, experiments were also performed in cases of using a mixture (PEDOT/PSS), where polystyrene sulfonate (PSS) was added as a dopant to a polythiophene derivative such as polyethylenedioxythiophene (PEDOT) as a hole injection layer forming material in combination with a solvent of nonane, decane, undecane, dodecane, hexanol, heptanal, octanol, nonyl alcohol, decyl alcohol, dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, tetraethylene glycol dimethyl ether, ethylene glycol, diethylene glycol, triethylene glycol, N-methylpyrrolidone, dimethylimidazolidinone, dimethyl sulfoxide, butyrolactone, 3-phenoxytoluene, 2-isopropyl naphthalene, dibenzyl ether, or isopropyl biphenyl.

As a result of the experiments described above, apart from cases where four types of solvents which are 3-phenoxytoluene, 2-isopropylnaphthalene, dibenzyl ether, and isopropyl biphenyl were used, results were obtained where the conditions of the contact angle θbc≤5° with respect to the side surface of the partition wall 133 and the contact angle θlc≤20° with respect to the coating region A were satisfied and the film forming state (the film thickness uniformity) was also favorable. Here, in cases where the solvents were the four types described above, the results were that although it was possible to satisfy the condition of θbc≤5°, it was not possible to satisfy the condition of θlc≤20° and the film forming state (the film forming uniformity) was also Δ, that is, the film thickness was partially in a non-uniform state due to the aggregation of molecules.

On the other hand, as a comparative example, experiments were also performed using the functional liquid 70 with the configurations described above, that is, including PEDOT/PSS as a hole injection layer forming material in a case where the inclination angle of the partition wall 133 exceeded 60 degrees, more specifically, in a case where the inclination angle was 70 to 80 degrees. As a result, apart from cases where four types of solvent which are 3-phenoxytoluene, 2-isopropylnaphthalene, dibenzyl ether, and isopropyl biphenyl were used, the results were that although it was possible to satisfy the conditions of the contact angle θbc≤5° and the contact angle θlc≤20°, the film forming state (the film thickness uniformity) was Δ, that is, the film thickness was partially in a non-uniform state due to the aggregation of molecules. Accordingly, the effects of setting the inclination angle of the partition wall 133 to 60 degrees or less, more specifically, substantially 45 degrees were confirmed.

Here, in a case where the solvents are four types of 3-phenoxytoluene, 2-isopropylnaphthalene, dibenzyl ether, and isopropyl biphenyl, the results were that it was not possible to satisfy the condition of θlc≤20° and the film forming state (the film thickness uniformity) was also ×, that is, the film thickness was in a non-uniform state due to the aggregation of molecules.

Functional Liquid 80

Experiments were performed using Poly[(9,9-dioctylfluorenyl-2,7-diyl)-co-(4,4'-(N-(4-sec-butylphenyl))diphenylamine)] which is a polymer hole transportation layer material other than (4,4',4"-tris(N,N-phenyl-3-methylphenylamino)triphenylamine) as the low molecular weight hole transportation layer material described above, as the functional liquid 80 which is used for forming the hole transportation layer 132c. Then, further experiments were performed using each of the two types of the hole transportation layer materials described above individually or in combination (a mixture) thereof. Then, experiments were also performed regarding the solvent using various types of solvents other than dipentyl ether individually or in combination.

Experiments were also performed in a case of using diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, tetraethylene glycol dimethyl ether, N-methylpyrrolidone, dimethylimidazolidinone, dimethyl sulfoxide, butyrolactone, 1,3-diisopropyl benzene, 1,4-diisopropyl benzene, triisopropyl benzene, pentyl benzene, hexyl benzene, heptyl benzene, octyl benzene, nonyl benzene, 3-phenoxytoluene, 2-isopropyl naphthalene, dibenzyl ether, isopropyl biphenyl as individual solvents.

A solvent where a plurality of solvents are combined is a solvent which is obtained by mixing any out of 3-phenoxytoluene, 2-isopropylnaphthalene, dibenzyl ether, and isopropyl biphenyl (referred to below as a "second solvent") with a first solvent which is described below.

The first solvent is any out of nonane, decane, undecane, dodecane, hexanol, heptanal, octanol, nonyl alcohol, decyl alcohol, dipentyl ether, diethylene glycol dimethyl ether, diethylene glycol ethyl methyl ether, diethylene glycol isopropyl methyl ether, diethylene glycol diethyl ether, diethylene glycol butyl methyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, tetraethylene glycol dimethyl ether, N-methylpyrrolidone, dimethylimidazolidinone, dimethyl sulfoxide, butyrolactone, 1,3-diisopropyl benzene, 1,4-diisopropyl benzene, triisopropyl benzene, pentyl benzene, hexyl benzene, heptyl benzene, octyl benzene, nonyl benzene, and 3-phenoxytoluene.

Regarding the mixing ratios of the first solvent and the second solvent, experiments were performed with four ratios of the first solvent and the second solvent which were 10:90, 30:70, 50:50, and 70:30.

Furthermore, the experiments described above were each implemented in a case of using (PEDOT/PSS) and in a case of using each of a total of four types of the hole injection layer materials described in paragraph 0078 as a forming material of the hole injection layer 132a which is a base or a combination of two or more types (referred to below as a "uniform material") in the measuring of the contact angle θlc with respect to the coating region A. Furthermore, as a comparative example, experiments using the functional liquid 80 described above were also performed in a case where the inclination angle of the partition wall 133 exceeded 60 degrees, more specifically, in a case where the inclination angle was 70 to 80 degrees. The results were as described below.

In a case where the inclination angle of the partition wall 133 was substantially 45 degrees with a combination of one individual solvent and a base of a uniform material, results were obtained for all of the solvents where the conditions of the contact angle θbc≤5° and the contact angle θlc≤20° were satisfied and where the film forming state (the film thickness uniformity) was also favorable.

In addition, also in a case where the inclination angle of the partition wall 133 was substantially 45 degrees with the combination of a solvent which was obtained by mixing the first solvent and the second solvent and a base of a uniform material, results were obtained for all of the solvents where the conditions of the contact angle θbc≤5° and the contact angle θlc≤20° were satisfied in all of the solvents and where the film forming state (the film thickness uniformity) was also favorable.

On the other hand, as a comparative example, in a case where the inclination angle of the partition wall 133 was 70 to 80 degrees in both of cases where one individual solvent was used and a case where a solvent which was obtained by mixing the first solvent and the second solvent was used, the results were that although it was possible to satisfy the conditions of the contact angle θbc≤5° and the contact angle θlc≤20°, the film forming state (the film thickness uniformity) was Δ, that is, the film thickness was partially in a non-uniform state due to the aggregation of molecules. Accordingly, the effects of setting the inclination angle of the partition wall 133 to 60 degrees or less, more specifically, substantially 45 degrees were confirmed.

In a case of using an individual solvent with a combination of the partition wall 133 where the inclination angle was substantially 45 degrees and a base of (PEDOT/PSS), apart from cases where four types of solvents which are 3-phenoxytoluene, 2-isopropylnaphthalene, dibenzyl ether, and isopropyl biphenyl were used, results were obtained where the conditions of the contact angle θbc≤5° and the contact angle θlc≤20° were satisfied and the film forming state (the film thickness uniformity) was also favorable. Here, in cases where the solvents were the four types described above, the results were that although it was possible to satisfy the condition of θbc≤5°, it was not possible to satisfy the condition of θlc≤20° and the film forming state (the film forming uniformity) was also Δ, that is, the film thickness was partially in a non-uniform state due to the aggregation of molecules.

In a case of using a solvent which was obtained by mixing the first solvent and the second solvent with a combination of the partition wall 133 where the inclination angle was substantially 45 degrees and a base of (PEDOT/PSS), apart from a case where the first solvent is 3-phenoxytoluene, results were obtained where the conditions of the contact angle θbc≤5° and the contact angle θlc≤20° were satisfied and where the film forming state (the film thickness uniformity) was also favorable. In a case where the first solvent was 3-phenoxytoluene, the results were that although it was possible to satisfy the condition of θbc≤5°, it was not possible to satisfy the condition of θlc≤20° and the film forming state (the film forming uniformity) was also Δ, that is, the film thickness was partially in a non-uniform state due to the aggregation of molecules.

In a case of using an individual solvent with a combination of the partition wall 133 where the inclination angle was 70 to 80 degrees and a base (PEDOT/PSS) as a comparative example, apart from cases where four types of solvents which are 3-phenoxytoluene, 2-isopropylnaphthalene, dibenzyl ether, and isopropyl biphenyl were used, results were obtained where although it was possible to satisfy the conditions of the contact angle θbc≤5° and the contact angle θlc≤20°, the film forming state (the film forming uniformity) was Δ, that is, the film thickness was partially in a non-uniform state due to the aggregation of molecules.

In addition, in cases where the solvent was any out of the four types which are 3-phenoxytoluene, 2-isopropylnaphthalene, dibenzyl ether, and isopropyl biphenyl, the results were that although it was possible to satisfy the condition of θbc≤5°, it was not possible to satisfy θlc≤20° and the film forming state (the film thickness uniformity) was also ×, that is, the film thickness was in a non-uniform state due to aggregation of molecules.

In the same manner, in a case of using a solvent which was obtained by mixing the first solvent and the second solvent with a combination of the partition wall 133 where the inclination angle was 70 to 80 degrees and a base of (PEDOT/PSS) as a comparative example, apart from a case of using 3-phenoxytoluene for the first solvent, the results were that although it was possible to satisfy the conditions of the contact angle θbc≤5° and the contact angle θlc≤20°, the film forming state (the film thickness uniformity) is Δ, that is, the film thickness was partially in a non-uniform state due to the aggregation of molecules. In addition, in a case of using 3-phenoxytoluene for the first solvent, the results were that although it was possible to satisfy the condition of the contact angle θbc≤5°, it was not possible to satisfy θlc≤20° and that the film forming state (the film thickness uniformity) was also ×, that is, the film thickness was in a non-uniform state due to the aggregation of molecules.

According to the results described above, at the time of forming the hole transportation layer 132c, the effects of setting the inclination angle of the partition wall 133 to 60 degrees or less, more specifically, substantially 45 degrees were confirmed.

Functional Liquid 90

As light emitting materials which are included in the functional liquid 90 which is used for forming the light emitting layers 132 (132r, 132b, and 132g) in the embodiment described above, Iridium(III)bis(2-(2'-benzothienyl)pridinato-N,C3')(acetylacetonate) is used as a red light emitting material, Alq3(Tris(8-hydroxyquinolato)aluminum(III)) is used as a green light emitting material, and Iridium(III)bis(2-(4,6-diflurophenyl)pyridinato-N,C2')picolinate is used as a blue light emitting material which are low molecular weight materials.

However, experiments were also performed using polymer materials in addition to the low molecular weight materials. As the polymer material, Poly[{9,9-dihexyl-2,7-bis(1-cyanovinylene)fluorenyl-ene}-alt-co-(2,5-bis(N,N'-diphenylamino)-1,4-henylene}] was used as the red light emitting material. Poly(9,9-dihexylfluorenyl-2,7-diyl) was used as the green light emitting material. Poly[(9,9-dioctylfluorenyl-2,7-diyl)-co-(N,N'-diphenyl)-N,N'-di(p-butylphenyl)1,4-diamino-benzene)] was used as the blue light emitting material. Then, the experiments were implemented in both of cases where the polymer materials were used individually and cases where low molecular weight materials and polymer materials were mixed.

Then, regarding the solvent, experiments were performed using various types of solvents other than dipentyl ether. Here, the solvents were the same as those which were used in the experiments for forming the hole transportation layer 132c described above. That is, the solvents were individual solvents or a solvent which was obtained by mixing the first solvent and the second solvent and the mixing ratios were also the same. Due to this, description of individual solvent names will be omitted. Description will be given below of the results of the experiment.

In a case of combining an individual solvent and the partition wall 133 where the inclination angle was substantially 45 degrees, results were obtained for all of the solvents where the conditions of the contact angle θbc≤5° and the contact angle θlc≤20° were satisfied and where the film forming state (the film thickness uniformity) was also favorable. In addition, in a case of using a solvent which was obtained by mixing the first solvent and the second solvent, results were obtained for all of the solvents where the conditions of the contact angle θbc≤5° and the contact angle θlc≤20° were satisfied and where the film forming state (the film thickness uniformity) was also favorable.

On the other hand, in a case where the inclination angle of the partition wall 133 was 70 to 80 degrees as a comparative example, in both of cases where one individual solvent was used and cases where a solvent which was obtained by mixing the first solvent and the second solvent was used, the results were that although it was possible to satisfy the conditions of the contact angle θbc≤5° and the contact angle θlc≤20°, the film forming state (the film thickness uniformity) was Δ, that is, the film thickness was partially in a non-uniform state due to the aggregation of molecules. Accordingly, the effects of setting the inclination angle of the partition wall 133 to 60 degrees or less, more specifically, substantially 45 degrees were confirmed.

Modification Example

The aspects of the invention are not limited to the embodiments described above and are able to be appropriately changed within a range which does not depart from the gist or the concept of the invention which is able to be read from the scope of the claims and the entirety of the specification. Methods for manufacturing the organic EL element 130 in accordance with such changes and methods for manufacturing the organic EL apparatus 100 where such methods for manufacturing the organic EL element 130 are applied are also included in the technical range of the invention. Various modification examples may be considered other than the embodiments described above. Description will be given below of the modification examples.

(Modification Example 1)

In the organic EL apparatus 100 described above, a total of three layers of the hole injection layer 132a, the hole transportation layer 132c, and the light emitting layer 132 are formed under conditions which are determined by the expressions (1) to (3) described above. However, an aspect where only a part of the three layers described above is formed under the conditions which are determined in the expressions (1) to (3) described above is also possible. The part is any one of the three layers described above or a combination of any two layers out of the three layers described above. Even when the configuration of the partition wall 133 or the like is the same, there is a possibility that the conditions which are determined by the expressions (1) to (3) described above will not be satisfied due to changes in a solvent or the like of the functional liquid.

(Modification Example 2)

In the organic EL apparatus 100 described above, the photosensitive resin material which configures the partition wall 133 is a negative type material. However, the photosensitive resin material is not limited to a negative type material and it is possible to use a positive type material.

(Modification Example 3)

In the organic EL apparatus 100 described above, out of the layers which configure the functional layer 137, only the light emitting layers 132 (r, g, and b) are different for each light emitting color. However, it is possible to differentiate the forming material for each light emitting color in the other layers, that is, the hole injection layer 132a or the hole transportation layer 132c.

(Modification Example 4)

The organic EL apparatus 100 described above is not limited to having the light emitting pixels 107 with three colors of red (R), green (G), and blue (B) and may have a configuration which includes a yellow (Y) light emitting pixel 107. According to this configuration, it is possible to improve the color reproducibility.

(Modification Example 5)

The organic EL apparatus 100 described above is a bottom emission type. However, even when the organic EL apparatus 100 is a bottom emission type, it is possible to implement the invention therein.

(Modification Example 6)

The counter electrode 134 is formed on the upper layer of the light emitting layer 132 in the organic EL apparatus 100 described above. However, an electron transportation layer may be formed between the light emitting layer 132 and the counter electrode 134. Furthermore, an electron injection layer may be formed between the electron transportation layer and the counter electrode 134. The electron transportation layer is a layer which has a function of transporting electrons which are injected from the counter electrode 134 to the light emitting layer 132 and a function of blocking holes which try to pass from the light emitting layer 132 to the counter electrode 134. The electron injection layer is a layer which has a function of improving the injection efficiency of the electrons from the counter electrode 134 to the electron transportation layer described above. It is preferable to form both using a vapor deposition method.

It is possible to use a quinoline derivative such as an organometallic complex where 8-quinolinols such as tris(8-quinolinolato)aluminum(Alq3) or 8-quinolinolato lithium (Liq) or derivatives thereof are set as a ligand, oxadiazole derivatives such as 2-(4-tert-butylphenyl)-5-(4-biphenyl)-1,3,4-oxadiazole(tBu-PBD) and 2,5-bis(1-naphthyl)1,3,4-oxadiazole(BND), silole derivatives, pyridine derivatives, pyrimidine derivatives, quinoxaline derivatives, imidazole derivatives, and the like as materials for the electron transportation layer. The thickness of the electron transportation layer is not particularly limited; however approximately 1 nm or more to 100 nm or less is preferable and approximately 5 nm or more to 50 nm or less is more preferable.

It is possible to use an alkali metal, an alkali earth metal, a rare earth metal, an alkali metal salt (an oxide, a fluoride, a chloride, or the like), an alkali earth metal salt (an oxide, a fluoride, a chloride, or the like), a rare earth metal salt (an oxide, a fluoride, a chloride, or the like) as the material of the electron injection layer.

It is preferable that the thickness of the electron injection layer be approximately 0.01 nm or more to 100 nm or less and approximately 0.1 nm or more to 10 nm or less is more preferable.

Embodiment 2

Electronic Equipment

Figure 14A:
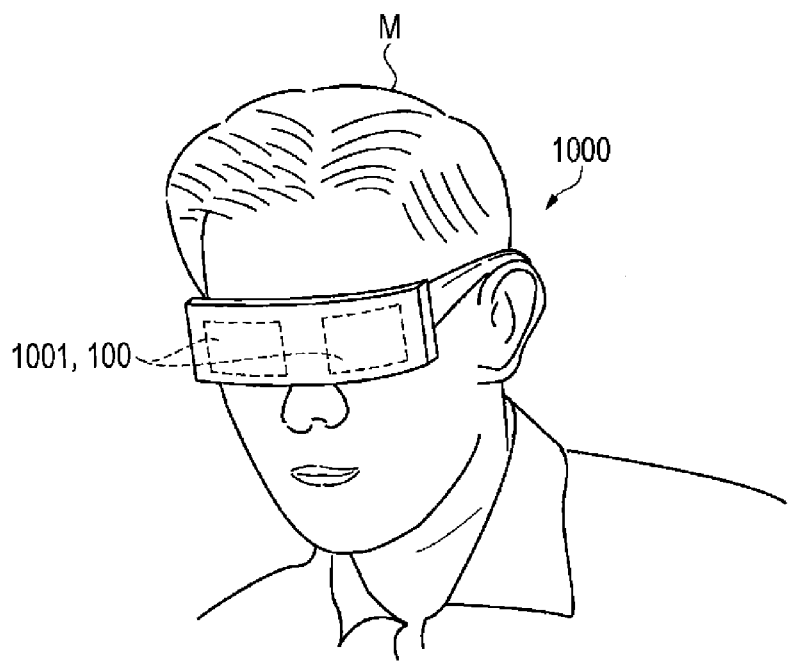
FIGS. 14A and 14B are diagrams which illustrate electronic equipment where
Figure 14B:
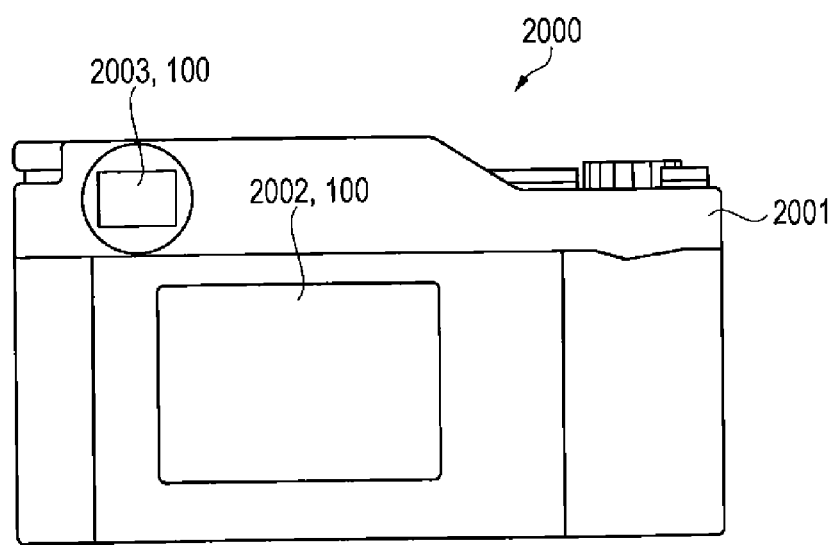

FIG. 14A is a schematic diagram which illustrates a head mounted display (HMD) as the electronic equipment. FIG. 14B is a schematic diagram which illustrates a digital camera as the electronic equipment. Below, the electronic equipment where the organic EL apparatus 100 according to Embodiment 1 described above is mounted will be described with reference to FIG. 14A and FIG. 14B.

As illustrated in FIG. 14A, a head mounted display (HMD) 1000 has two display sections 1001 which are provided corresponding to left and right eyes. An observer M is able to see text, images, or the like which are displayed on the display section 1001 by wearing the head mounted display 1000 on their head like glasses. For example, it is possible to enjoy watching a three-dimensional movie when images where parallax is taken into consideration are displayed on the left and right display sections 1001.

The organic EL apparatus 100 according to Embodiment 1 is mounted on the display section 1001. Since the organic EL apparatus 100 has the organic EL element 130 where the uniformity of the film thickness of the functional layer 137 is improved and where uniform light emission is obtained, it is possible to provide a head mounted display 1000 where image display quality is improved.

As illustrated in FIG. 14B, a digital camera 2000 has a body 2001 which has an optical system such as an imaging element. A monitor 2002 which displays an image or the like which is imaged and an electronic view finder 2003 for visually confirming an object are provided in the body 2001. The organic EL apparatus 100 according to the embodiment 1 is mounted on the monitor 2002 and the electronic view finder 2003. Since the organic EL apparatus 100 has the organic EL element 130 where the uniformity of the film thickness of the functional layer 137 is improved and where uniform light emission is obtained, it is possible to provide the digital camera 2000 where image display quality is improved.

Here, the electronic equipment where the organic EL apparatus 100 is mounted is not limited to the head mounted display 1000 or the digital camera 2000 described above. Examples include electronic equipment which has a display section such as a personal computer, a portable information terminal, a navigator, a viewer, or a head up display.

The entire disclosure of Japanese Patent Application No. 2013-210774, filed Oct. 8, 2013 is expressly incorporated by reference herein.

What is claimed is:

1. An organic EL element manufacturing method comprising:

forming a pixel electrode on a substrate;

forming a partition wall which surrounds a periphery of the pixel electrode;

coating ink which contains a functional layer forming material in a coating region which is surrounded by the partition wail; and forming a functional layer in the coating region by drying the ink which is coated, wherein in the forming of the partition wall, the partition wall is formed such that a side surface of the partition wall which intersects with respect to a surface of the pixel electrode forms an angle of 40 degrees to 60 degrees with respect to the surface of the pixel electrode, and in the coating of the ink, the ink is coated so as to satisfy the following expressions (1) to (3), in a case where a contact angle of the ink with respect to the side surface of the partition wall is set to θbc and the contact angle with respect to a surface of the coating region where the ink is coated is set to θlc $$\theta bc \leq \theta lc \quad (1)$$

$$\theta bc \leq 5° \quad (2)$$

$$\theta lc \leq 20° \quad (3).$$

2. The organic EL element manufacturing method according to claim 1, wherein the functional layer includes at least three layers of a hole injection layer, a hole transportation layer, and a light emitting layer which are laminated in sequence on the pixel electrode, and at least one layer out of the three layers is formed by dropping the ink so as to satisfy the expressions (1) to (3).

3. The organic EL element manufacturing method according to claim 1, wherein the ink contains the functional layer forming material which includes only a polymer material, only a low molecular weight material, or a mixture of a polymer material and a low molecular weight material.

4. An organic EL apparatus comprising:

an organic EL element which is manufactured using the organic EL element manufacturing method according to claim 1.

5. An organic EL apparatus comprising:

an organic EL element which is manufactured using the organic EL element manufacturing method according to claim 2.

6. An organic EL apparatus comprising:

an organic EL element which is manufactured using the organic EL element manufacturing method according to claim 3.

7. Electronic equipment comprising:

the organic EL apparatus according to claim 4.

8. Electronic equipment comprising:

the organic EL apparatus according to claim 5.

9. Electronic equipment comprising:

the organic EL apparatus according to claim 6.

* * * * *